US012660110B2

(12) United States Patent
Choi et al.

(10) Patent No.: US 12,660,110 B2
(45) Date of Patent: Jun. 16, 2026

(54) DISPLAY APPARATUS

(71) Applicant: SAMSUNG ELECTRONICS CO., LTD., Suwon-si (KR)

(72) Inventors: Daesu Choi, Suwon-si (KR); Jisu Kim, Suwon-si (KR); Hunsung Kim, Suwon-si (KR); Sangbong Jeon, Suwon-si (KR); Hyunyong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 126 days.

(21) Appl. No.: 18/618,700

(22) Filed: Mar. 27, 2024

(65) Prior Publication Data

US 2024/0244777 A1 Jul. 18, 2024

Related U.S. Application Data

(63) Continuation of application No. PCT/KR2022/017220, filed on Nov. 4, 2022.

(30) Foreign Application Priority Data

Dec. 28, 2021 (KR) ........................ 10-2021-0189946

(51) Int. Cl.
H05K 5/02 (2006.01)

(52) U.S. Cl.
CPC ......... H05K 5/0247 (2013.01); H05K 5/0217 (2013.01)

(58) Field of Classification Search
USPC ........................................ 361/807, 809, 810
See application file for complete search history.

(56) References Cited

U.S. PATENT DOCUMENTS 3,417,192 A * 12/1968 Elm ........................ H01R 4/489
174/59
5,816,081 A * 10/1998 Johnston ............ E05B 73/0005
70/164
(Continued)

FOREIGN PATENT DOCUMENTS

CN 107851944 A * 3/2018 ............... H04N 5/64
CN 113163142 A 7/2021
(Continued)

OTHER PUBLICATIONS

International Search Report (PCT/ISA/210) issued by the International Searching Authority on Feb. 17, 2023 in corresponding International Application No. PCT/KR2022/017220.
(Continued)

*Primary Examiner* — Hung S. Bui
(74) *Attorney, Agent, or Firm* — Sughrue Mion, PLLC

(57) ABSTRACT

A display apparatus includes: a display panel; a housing provided to receive the display panel and comprising a rear cover; a rotation device coupled to a rear side of the rear cover and configured to rotate the housing; a cable provided on the rear side of the rear cover and configured to be connected to a first electrical component in the housing; a first guide holder configured to be detachable from the rear side of the rear cover and to guide and hold the cable, and a second guide holder fixed to the rotation device and configured to guide and hold the cable.

18 Claims, 20 Drawing Sheets

1

(56) References Cited

U.S. PATENT DOCUMENTS

| | | | |
|---|---|---|---|
| 6,229,584 B1 * | 5/2001 | Chuo | G06F 1/1601 |
| | | | 345/905 |
| 7,682,170 B2 | 3/2010 | Hori et al. | |
| 8,035,957 B2 | 10/2011 | Jung | |
| 8,047,487 B2 | 11/2011 | Hwang et al. | |
| 8,310,468 B2 | 11/2012 | Martin | |
| 10,820,434 B2 | 10/2020 | Choi et al. | |
| 11,174,984 B2 | 11/2021 | Kim | |
| 2004/0047115 A1 | 3/2004 | Helot et al. | |
| 2015/0163935 A1 | 6/2015 | Kasuga | |
| 2015/0289390 A1 | 10/2015 | Choi et al. | |
| 2023/0125914 A1 | 4/2023 | Choi et al. | |

FOREIGN PATENT DOCUMENTS

| | | |
|---|---|---|
| EP | 0 061 499 B1 | 9/1987 |
| EP | 3 730 830 A1 | 10/2020 |
| JP | 2005-318241 A | 11/2005 |
| JP | 2016-206564 A | 12/2016 |
| KR | 20-1998-0028851 U | 8/1998 |
| KR | 10-2001-0027292 A | 4/2001 |
| KR | 10-2006-0008692 A | 1/2006 |
| KR | 10-0609852 B1 | 8/2006 |
| KR | 10-0684997 B1 | 2/2007 |
| KR | 10-2009-0027673 A | 3/2009 |
| KR | 10-0907352 B1 | 7/2009 |
| KR | 10-2011-0038559 A | 4/2011 |
| KR | 10-2011-0055345 A | 5/2011 |
| KR | 10-1361297 B1 | 2/2014 |
| KR | 10-2014-0110282 A | 9/2014 |
| KR | 10-2017-0118318 A | 10/2017 |
| KR | 10-2018-0026949 A | 3/2018 |
| KR | 10-2019-0019021 A | 2/2019 |
| KR | 10-2020-0125382 A | 11/2020 |
| WO | 2014/006719 A1 | 1/2014 |

OTHER PUBLICATIONS

Extended European Search Report dated Dec. 9, 2024, issued by the European Patent Office in European Application No. 22916377.9.

Communication dated Jul. 25, 2025, issued by the European Patent Office in European Application No. 22 916 377.9.

* cited by examiner

FRONT

REAR

DISPLAY APPARATUS

CROSS-REFERENCE TO RELATED APPLICATIONS

This application is a continuation of International Application No. PCT/KR2022/017220, filed on Nov. 4, 2022, which is based on and claims priority to Korean Patent Application No. 10-2021-0189946, filed on Dec. 28, 2021, in the Korean Intellectual Property Office, the disclosures of which are incorporated by reference herein in their entireties.

BACKGROUND

1. Field

The disclosure relates to a display apparatus, and more particularly to a display device with an improved cable arrangement structure.

2. Description of the Related Art

Display devices visually display acquired or stored image information to a user.

A display device may include a display module that displays an image, and a support device that supports the display module. The support device may be provided to support the display module such that a front surface of the display module, on which the image is displayed, faces a viewer. The support device may include a stand and a wall mount.

A display module is typically arranged so that the length of its horizontal side is greater than the length of its vertical side. When a vertical image is displayed on the display module where the length of the horizontal side is greater than that of the vertical side, there are disadvantages to efficiently use a screen display area of the display module, and vice versa.

The display module may include a housing that receives a display panel, a rotation device that is coupled to the housing and is provided to support and rotate the display module to efficiently use the screen display area of the display module, and cables connected to electrical components in the housing.

When the housing and the display panel are rotated by the rotation device, the arrangement of the cables may be changed or twisted, which may cause the cables to become disconnected. Accordingly, a structure is needed that may prevent the cables from being twisting and disconnected even when the housing and the display panel are rotated.

According to one or more embodiments, a display apparatus can be provided in which the arrangement of cables is improved using a guide holder, and twisting and disconnection of the cables can be prevented even when the display panel and the housing are rotated.

SUMMARY

According to an aspect of the disclosure, a display apparatus includes: a display panel; a housing provided to receive the display panel and comprising a rear cover; a rotation device coupled to a rear side of the rear cover and configured to rotate the housing; a cable provided on the rear side of the rear cover and configured to be connected to a first electrical component in the housing; a first guide holder configured to be detachable from the rear side of the rear cover and to guide and hold the cable, and a second guide holder fixed to the rotation device and configured to guide and hold the cable.

The rear cover may include a connector portion which may be configured to allow the cable to be connected to the first electrical component in the housing, and the cable may be sequentially connected the connector portion, the first guide holder, and the second guide holder to an outside of the display apparatus The first guide holder may be attached to the rear cover, and the second guide holder may be below the rotation device in a vertical direction of the rear cover.

The rotation device may be coupled to a central portion of the rear cover, and a rotation axis of the rotation device may be located at an angle of 45 degrees from the first guide holder based on a horizontal axis.

The housing may be arranged in a first mode in a state in which a long side of the housing extends in a first direction and a short side of the housing extends in a second direction, the housing may be further configured to be arranged in a second mode in a state in which the long side of the housing extends in the second direction and the short side of the housing extends in the first direction, and the housing is configured to rotate from the first mode to the second mode and from the second mode to the first mode.

The connector portion may be formed in the central portion of the rear cover and may be configured to be covered by the rotation device.

The connector portion may be a first connector portion, and the rear cover may further include a second connector portion formed on a lateral side of the first connector portion.

The cable may be a first cable, the display apparatus may further include a second cable connected to a second electrical component in the housing and sequentially connected the second connector portion, the first guide holder, and the second guide holder to the outside of the display apparatus.

The display apparatus may further include a coupling bracket coupled to the rotation device and the rear cover and may be configured to couple the rotation device to the rear cover.

The coupling bracket may include the first guide holder, and the first guide holder may have an angle of 45 degrees relative to a central portion of the rear cover and a horizontal axis.

The first guide holder may include an adhesive member attached to a rear wall of the rear cover, and a mounting member mounted on the adhesive member, wherein the adhesive member includes an extension extending toward the mounting member and may be configured to enable the cable to be wound between the adhesive member and the mounting member.

The second guide holder may include a case coupled to the rotation device and may be configured to accommodate the cable, and a cover coupled to the case and configured to cover the cable accommodated in the case.

The case may include a receiving portion which may be configured to receive the cable passing through the first guide holder, a winding portion protruding from the receiving portion toward the cover and may be configured to enable the cable to be wound, and a lower hole opened in a lower portion of the case to enable the cable wound on the winding portion to be connected to the outside of the display apparatus.

The display apparatus ma further include a coupling bracket each coupled to the rotation device and the rear cover and may be configured to couple the rotation device to the rear cover, wherein the rotation device includes a drive motor, a plurality of gears interlocked with the drive motor, and a rotating holder configured to rotate together with the coupling bracket.

The rotation device may include a first case coupled to the rotating holder and may be configured to receive the drive motor, the plurality of gears, and the rotating holder, and a second case coupled to a rear side of the first case.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 8 is an exploded perspective view of the rotation device in the display apparatus according to one or more embodiments;

FIG. 13 is a top view from the rear of the display apparatus according to one or more embodiments;

FIG. 16 is a top view from the rear of the display apparatus shown in FIG. 13 according to one or more embodiments;

DETAILED DESCRIPTION

Figure 1:
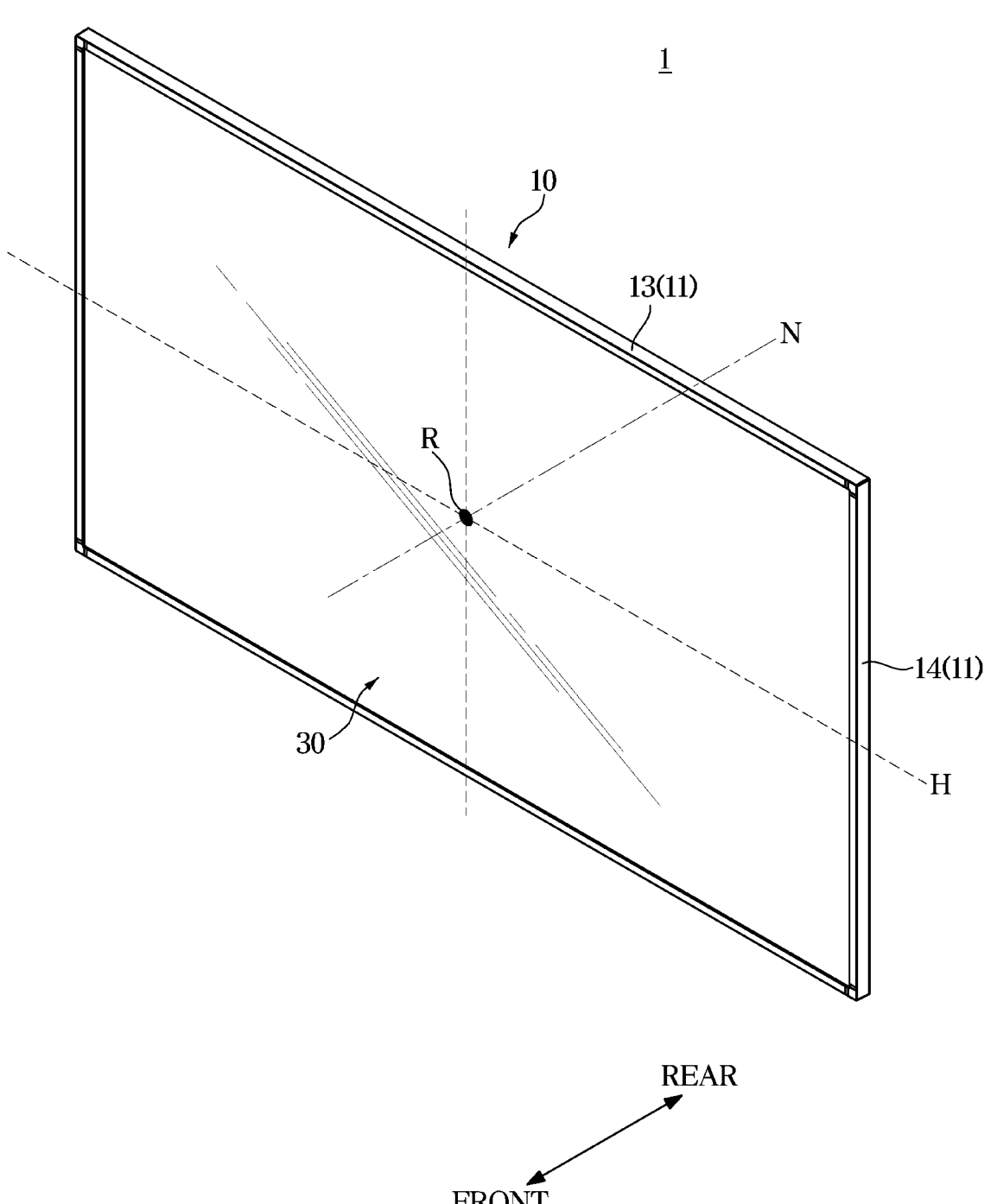
FIG. 1 is a front perspective view of a display apparatus showing a display module disposed horizontally, according to one or more embodiments.

Embodiments described in the disclosure and configurations shown in the drawings are merely examples of the embodiments of the disclosure and may be modified in various different ways at the time of filing of the present application to replace the embodiments and drawings of the disclosure.

In addition, the same reference numerals or signs shown in the drawings of the disclosure indicate elements or components performing substantially the same function. The singular form of a noun corresponding to an item may include one or a plurality of the items unless clearly indicated otherwise in a related context.

Also, the terms used herein are used to describe the embodiments and are not intended to limit or restrict the disclosure. The singular forms "a," "an" and "the" are intended to include the plural forms as well, unless the context clearly indicates otherwise. In this disclosure, the terms "including", "having", and the like are used to specify features, figures, steps, operations, elements, components, or combinations thereof, but do not preclude the presence or addition of one or more of the features, figures, steps, operations, elements, components, or combinations thereof.

It will be understood that, although the terms first, second, primary, secondary, etc., may be used herein to describe various elements, however the elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

Further, as used in the disclosure, the terms "front", "rear", "top", "bottom", "side", "left", "right", "upper", "lower", and the like are defined with reference to the drawings, and are not intended to limit the shape and position of each component.

One or more embodiments of the disclosure will be described in detail below with reference to the accompanying drawings.

Figure 2:
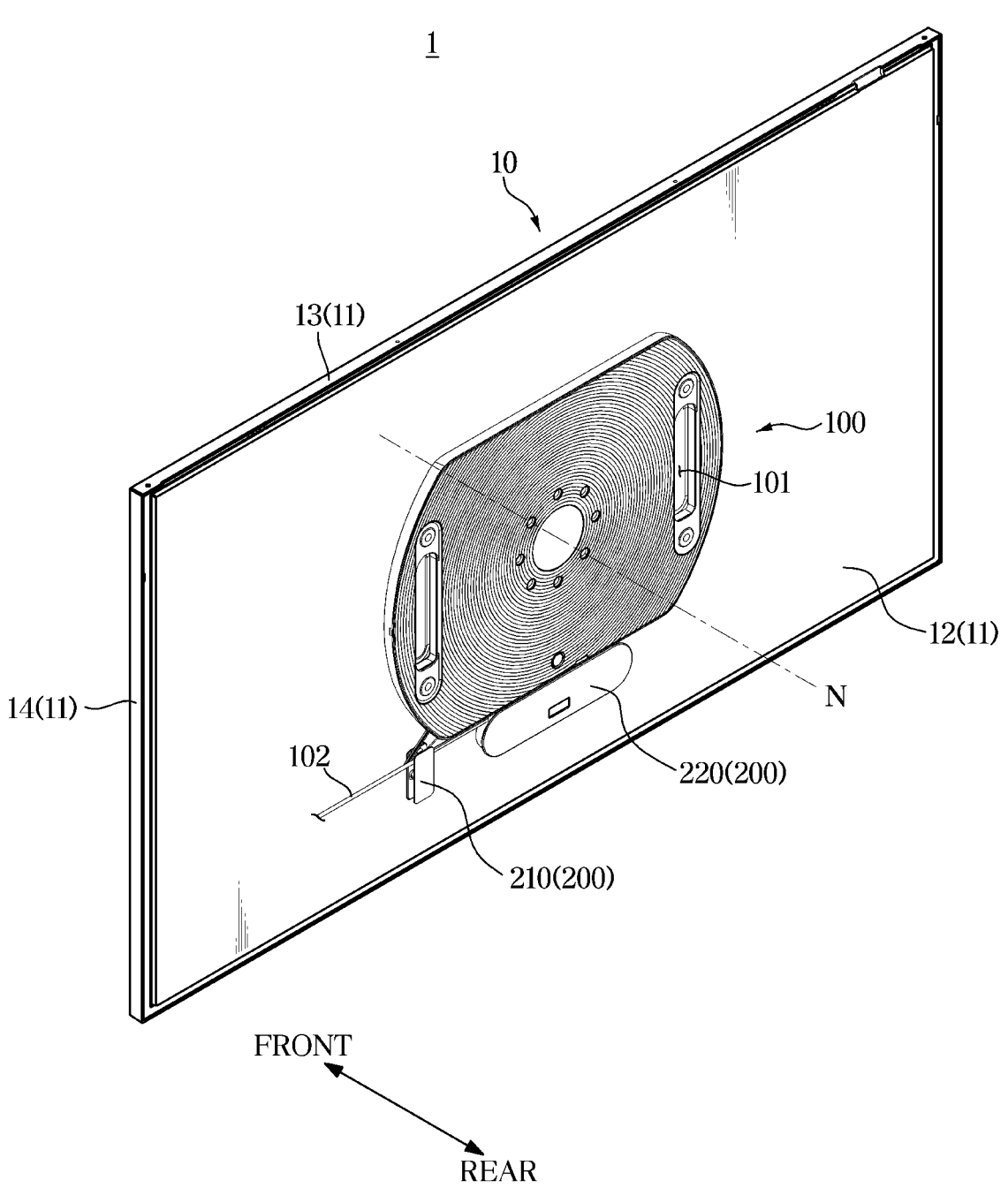
FIG. 2 is a rear perspective view of the display apparatus shown in FIG. 1 according to one or more embodiments.
Figure 3:
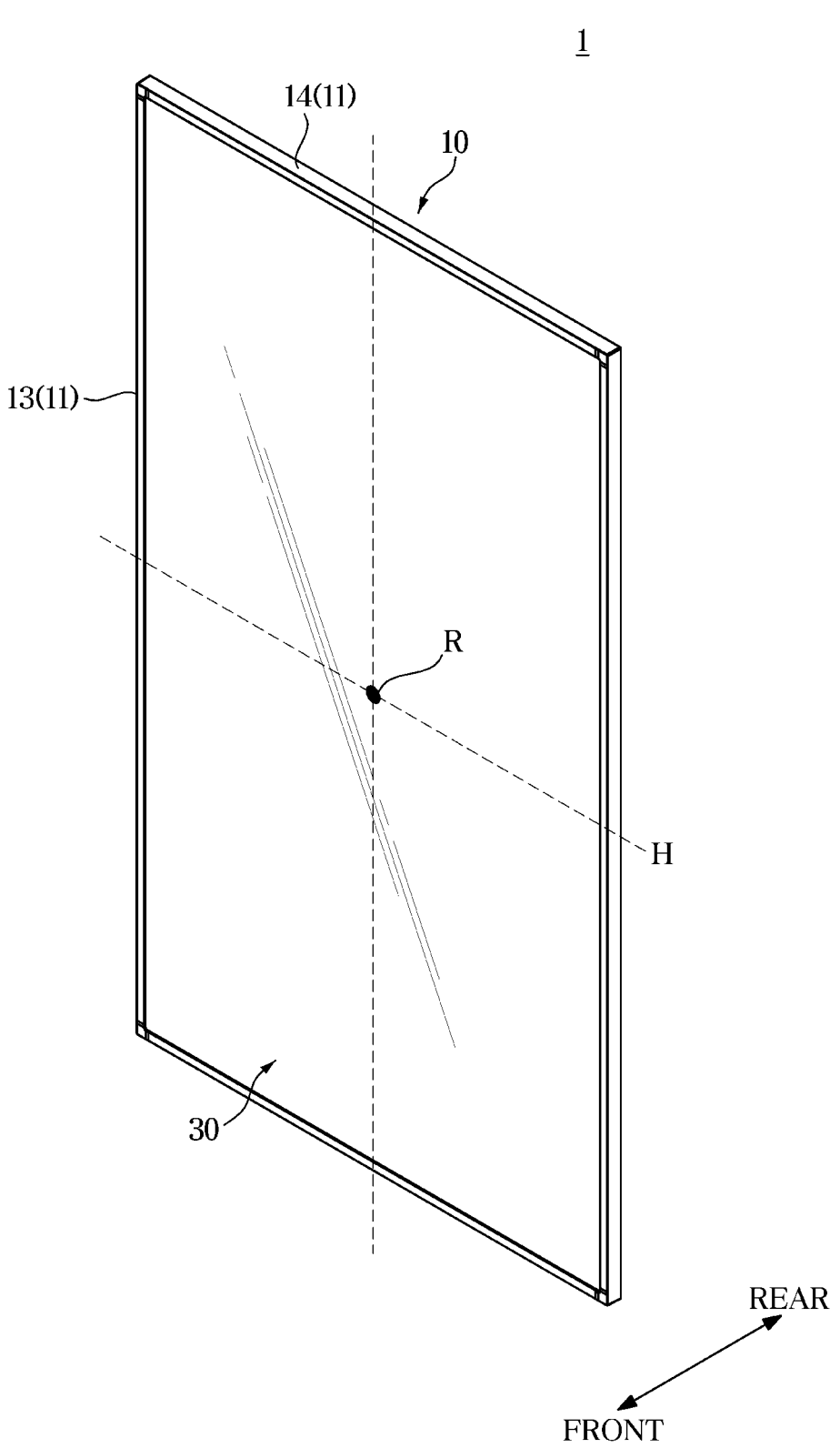
FIG. 3 is a perspective view of the display apparatus showing the display module disposed vertically according to one or more embodiments.
Figure 4:
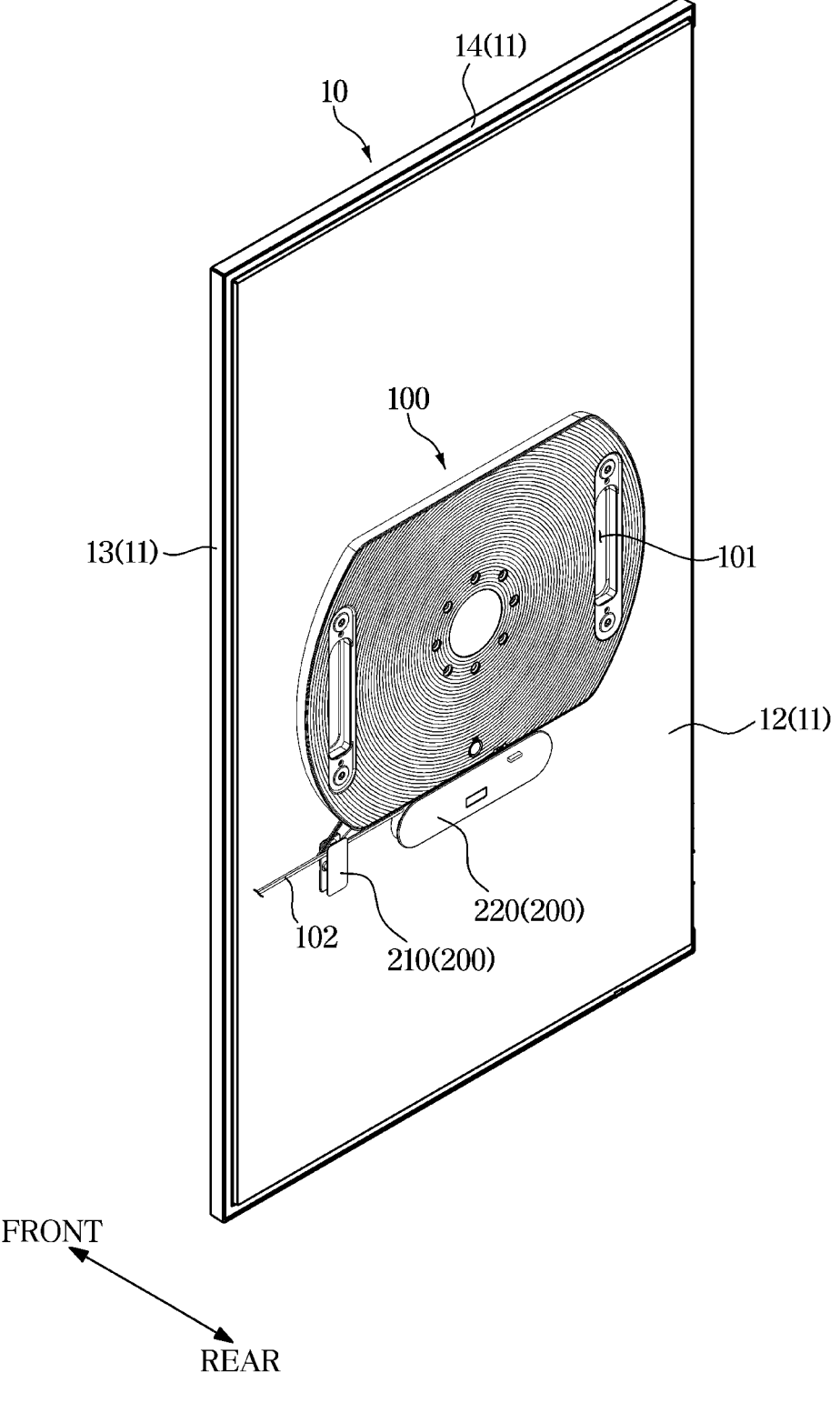
FIG. 4 is a rear perspective view of the display apparatus shown in FIG. 3 according to one or more embodiments.

FIG. 1 is a perspective view showing a display apparatus wherein the display module is disposed horizontally according to one or more embodiments. FIG. 2 is a rear perspective view showing the display apparatus shown in FIG. 1 according to one or more embodiments. FIG. 3 is a perspective view showing the display apparatus wherein the display module is disposed vertically according to one or more embodiments. FIG. 4 is a rear perspective view of the display apparatus shown in FIG. 3 according to one or more embodiments.

A display apparatus 1 according to one or more embodiments may include a display module 10 and a rotation device 100.

The display apparatus 1 may be a device that displays information, materials, data, and the like in the form of characters, shapes, graphs, images, and the like, and may include a television, a monitor, and the like. The display apparatus 1 may include a display module 20.

The display module 10 may be configured to display a screen. The display module 10 may include a display panel 30. The display panel 30 may include a self-emissive display panel, such as an organic light-emitting diode (OLED) or a non-emissive display panel, such as a liquid crystal display (LCD). No particular limitation is made on the type of display panel 30.

The display module 10 may include a housing 11. The housing 11 may accommodate the display panel 30. The housing 11 may include a rear cover 12. The rear cover 12 may cover a rear side of the display panel 30. The rear cover 12 may form the rear exterior of the display module 10.

The display module 10 may be arranged to have different lengths of horizontal and vertical sides. The display module 10 may be arranged to have a long side 13 and a short side 14. The display module 10 may be arranged in the shape of a rectangular plate. The long side 13 and short side 14 of the display module 10 may be the long side 13 and short side 14 of the housing 11.

The rotation device 100 may be coupled to a rear side of the display module 10. The rotation device 100 may be coupled to a rear side of the housing 11 that accommodates the display panel 30. The rotation device 100 may be coupled to the rear cover 12.

The rotation device 100 may be arranged to support the display module 10 and to rotate the display module 10. The rotation device 100 may rotate the display panel 30 and the housing 11.

The display apparatus 1 may include a stand, wherein the display module 10 may be arranged to be mounted on the stand or on a wall. The stand or wall may be provided with a mount protrusion to be inserted into a mount groove 101 of the rotation device 100. According to one or more embodiments, the rotation device 100 may be mounted on the stand or the wall by inserting the mount protrusion into the mount groove 101. The display panel 30 and the housing 11 may be mounted on the stand or the wall by coupling with the rotation device 100.

The rotation device 100 may be supplied with power via a rotation drive cable 102 connected to an external power source. The rotation device 100 may rotate the display module 10 by being powered to drive a drive motor 180 (see FIG. 8), which will be described later. The rotation device 100 may be an electric (or motorized) rotation device 100.

Referring to FIGS. 1 and 3, the display module 10 may be positioned in either a first mode in which the long side 13 is positioned vertically, or a second mode in which the long side 13 is positioned horizontally. The rotation device 100 may be arranged to allow the display module 10 to be rotated between the first mode and the second mode. The first mode may be referred to as a portrait mode, and the second mode may be referred to as a landscape mode. Furthermore, a vertical direction may be a first direction, and a horizontal direction may be a second direction.

Referring to FIGS. 1 and 2, the display module 10 may be rotated from the first mode to the second mode or from the second mode to the first mode based on a rotation center R and a rotation axis N.

The display apparatus 1 may include a guide holder 200. The guide holder 200 may hold and guide cables 5, 6, and 7, which will be described later. The cables 5, 6, and 7 may be connected to electrical components arranged in the housing 11 to drive the display module 10. The electrical components arranged in the housing 11 may be different from each other. Thus, the electrical components arranging in the housing 11 may include a first electrical component, a second electrical component, and a third electrical component. The number of electrical components arranged in the housing 11 is not limited thereto. The guide holder 200 may be placed at the rear side of the housing 11. The guide holders 200 may be provided in a plurality.

The plurality of guide holders 200 may include a first guide holder 210 and a second guide holder 220. The first guide holder 210 may be coupled, mounted, or attached to the housing 11. The first guide holder 210 may be attached to the rear cover 12 at a rear side of the rear cover 12. The first guide holder 210 may be separable from the rear cover 12, so as to be detachable from the rear side of the rear cover 12.

The second guide holder 220 may be coupled, mounted, and/or secured to the rotation device 100. The second guide holder 220 may be secured to the rotation device 100 by means of a fastener S. The first guide holder 210 and the second guide holder 220 may be disposed on a lower side of the rotation device 100.

Figure 5:
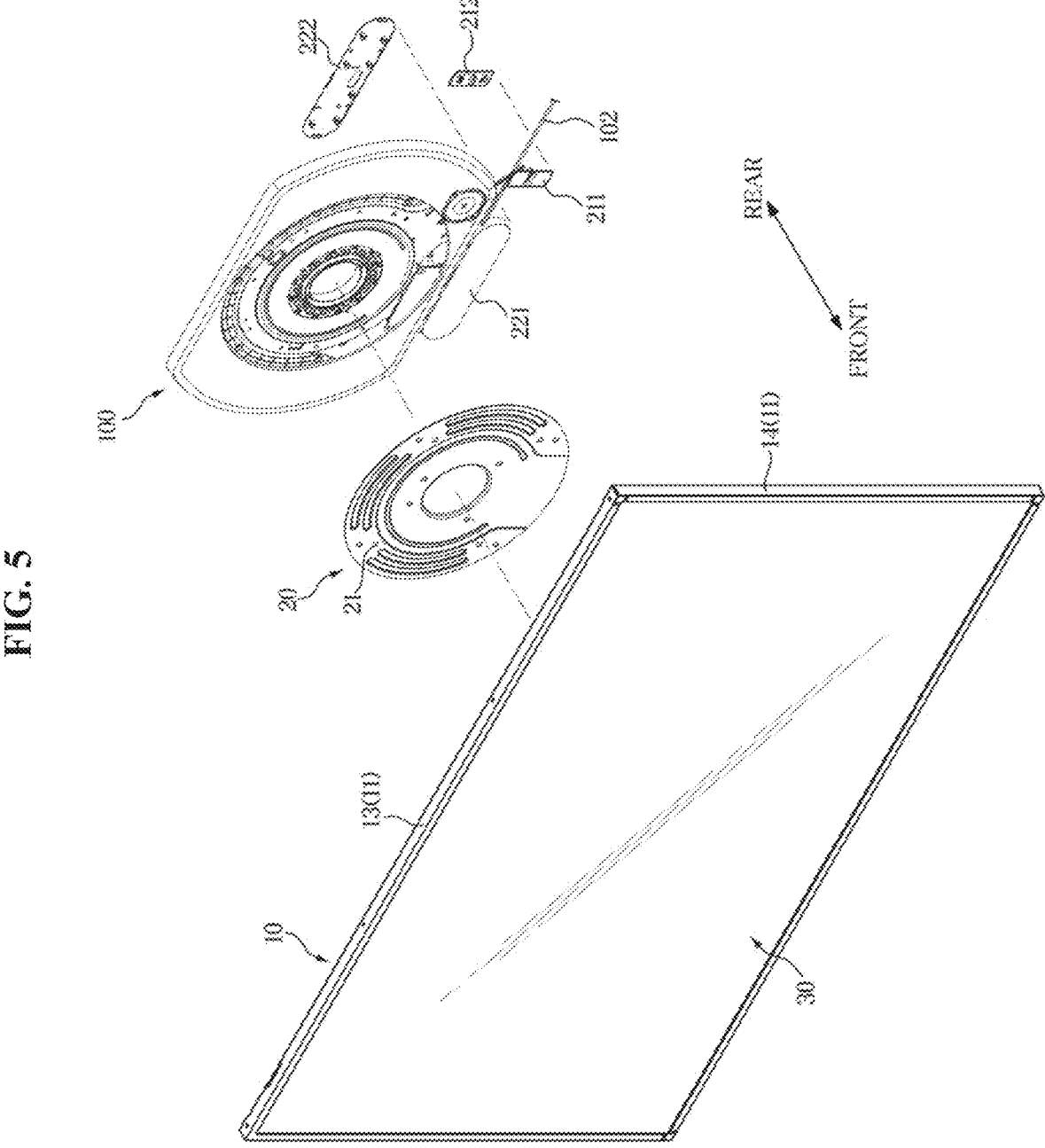
FIG. 5 is a perspective view of the display apparatus of FIG. 3 with the display module, a bracket, and a rotation device removed according to one or more embodiments.
Figure 6:
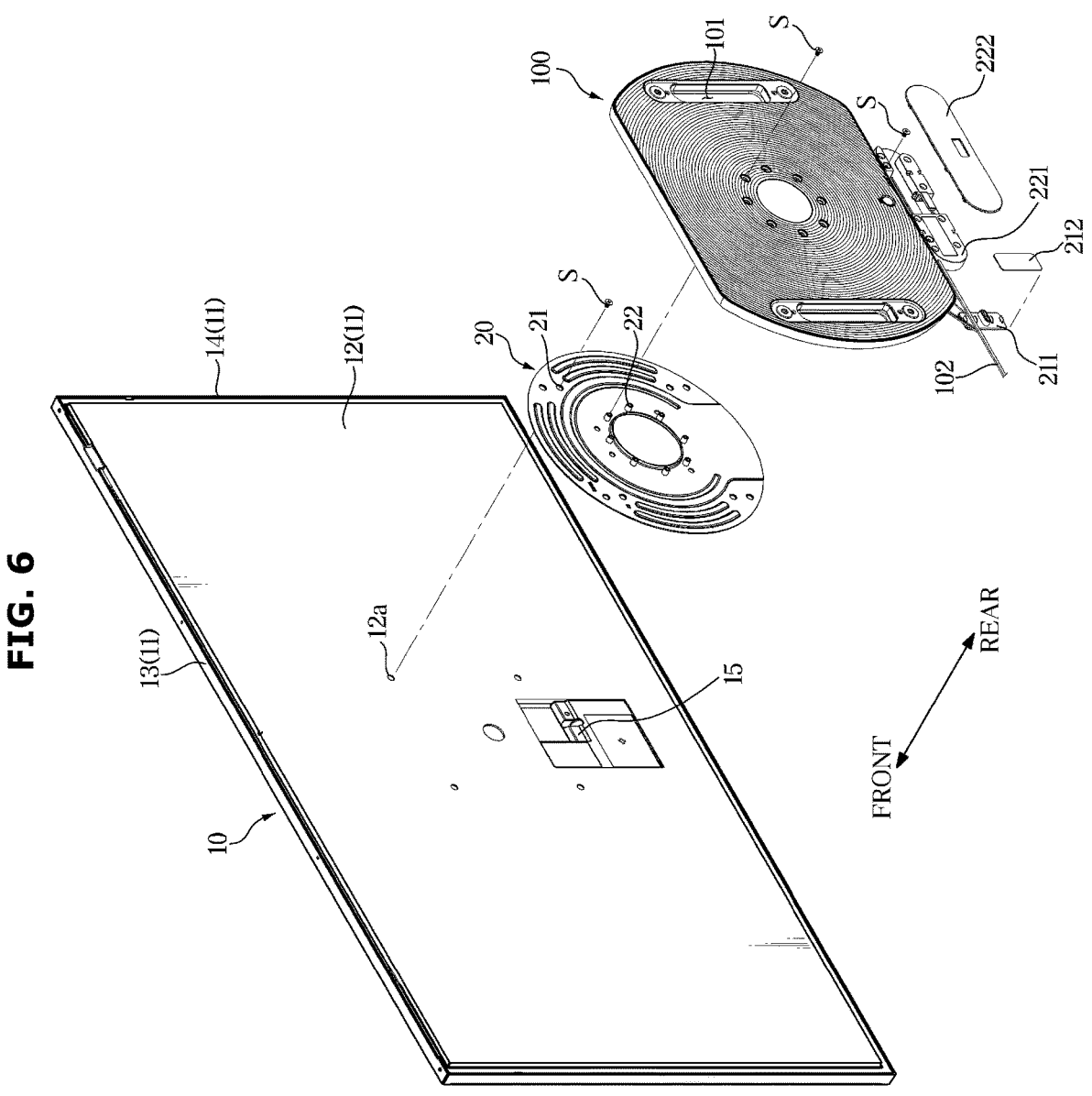
FIG. 6 is a view of the display apparatus shown in FIG. 5 from another angle according to one or more embodiments.

FIG. 5 is a view showing the display apparatus with the display panel 30, a bracket, and the rotation device removed according to one or more embodiments. FIG. 6 is a view showing the display apparatus shown in FIG. 5 from another angle according to one or more embodiments.

According to one or more embodiments, the display apparatus 1 may include a bracket 20. The bracket 20 may be disposed between the display module 10 and the rotation device 100. The bracket 20 may be disposed between the rear cover 12 and the rotation device 100 to couple the rotation device 100 to the rear cover 12.

The bracket 20 may be coupled to the rear side of the housing 11. The bracket 20 may be coupled to the rear cover 12. The bracket 20 may be coupled to the housing 11 to rotate together with the housing 11 and the display panel 30. The bracket 20 may include bracket holes 21. The bracket holes 21 may be arranged to correspond to module holes 12a provided in the rear cover 12. The fastener S, such as a screw, may pass through the bracket holes and be fastened to the module holes 12a, thereby coupling the bracket 20 to the rear side of the housing 11. The bracket 20 may be referred to as the coupling bracket 20.

The rotation device 100 may be coupled to the bracket 20. The rotation device 100 may be coupled to the housing 11 by being coupled to the bracket 20. The rotation device 100 may be arranged to rotate the bracket 20. By rotating the bracket 20, the rotation device 100 may rotate the housing 11 coupled to the bracket 20 and the display panel 30 accommodated in the housing 11. The bracket 20 may include bracket bosses 22. The fastener S, such as a screw, may be fastened to the bracket bosses 22 from the rear side of the rotation device 100, thereby coupling the rotation device 100 to the bracket 20.

The bracket 20 may have a circular shape. The bracket 20 may couple the housing 11 and the rotation device 100.

The display apparatus may further include a connector portion 15. The cable 5, which will be described later, may be connected to the connector portion 15. The cable 5 may be connected via the connector portion 15 to an electrical component disposed within the housing 11 to drive the display module 10. The connector portion 15 may be concealed or hidden by the rear cover 12 when the rotation device 100 is coupled to the rear cover 12.

The first guide holder 210 may include an adhesive member 211 and a mounting member 212. The adhesive member 211 may be attached and/or bonded to the rear cover 12. The adhesive member 211 and the mounting member 212 may be coupled. The mounting member 212 may be disposed behind the adhesive member 211. The cable 5 may be disposed between the adhesive member 211 and the mounting member 212.

The second guide holder 220 may include a case 221 and a cover 222. The case 221 may be coupled to the rotation device 100. The case 221 may be mounted to the rotation device 100 from a lower side of the rotation device 100. The cover 222 may cover the case 221. The cover 222 may be mounted or coupled to case 221. The cover 222 may be disposed on a rear side of the case 221. The cover 222 may receive the cable 5 between the case 221 and the cover 222.

Figure 7:
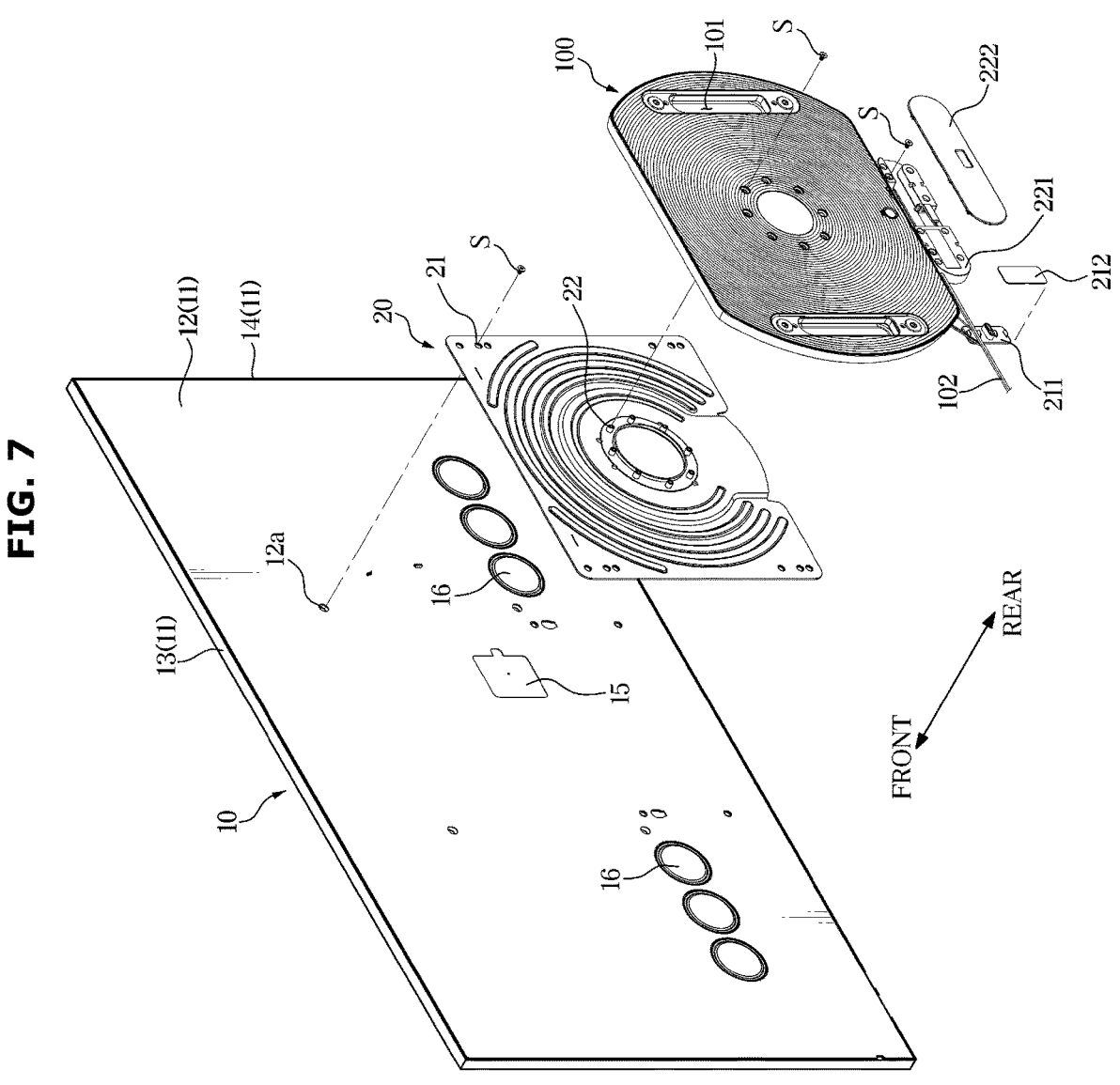
FIG. 7 is a view of the display apparatus with the display module, the bracket, and the rotation device removed according to one or more embodiments.

FIG. 7 is a view showing the display apparatus wherein the display module, the bracket, and the rotation device are separated according to one or more embodiments.

Referring to FIG. 7, the display apparatus according to one or more embodiments may include the display module 10, the rotation device 100, and the bracket 20.

The bracket 20 may have a rectangular shape. The bracket 20 may couple the housing 11 and the rotation device 100.

The bracket 20 may be coupled to the rear side of the housing 11. The bracket 20 may be coupled to the rear cover 12. The bracket 20 may include the bracket holes 21. The bracket holes 21 may be formed at corners of the bracket 20. The bracket holes 21 may be arranged to correspond to the module holes 12a provided in the rear cover 12. The fastener S, such as a screw, may pass through the bracket holes 21 and be fastened to the module holes 12a, thereby coupling the bracket 20 to the rear side of the housing 11. The bracket 20 may be referred to as the coupling bracket 20.

A speaker hole 16 may be formed in the rear cover 12. A plurality of speaker holes 16 may be provided. The plurality of speaker holes 16 may be arranged along the same direction as the long side 13.

Figure 8:
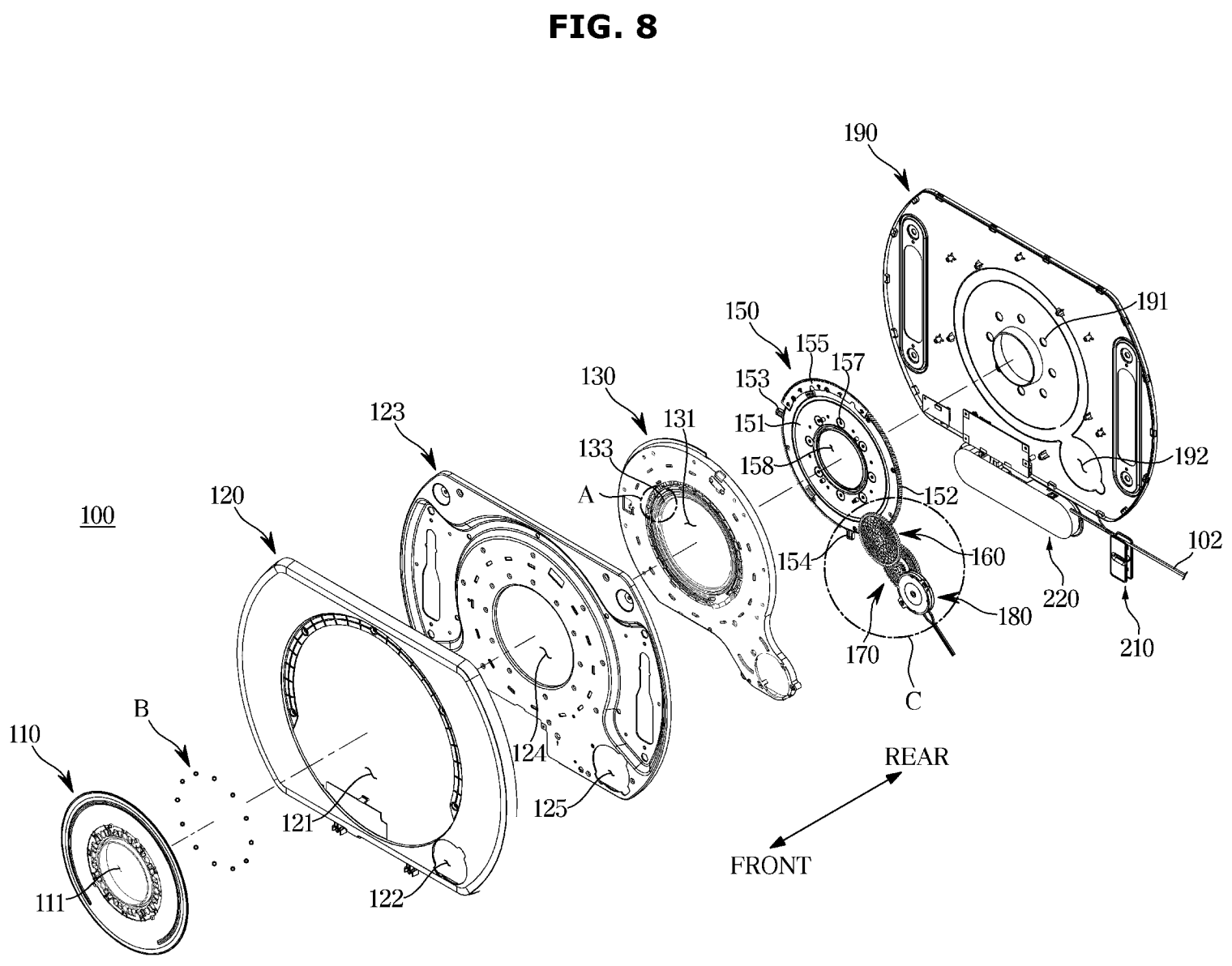
Figure 9:
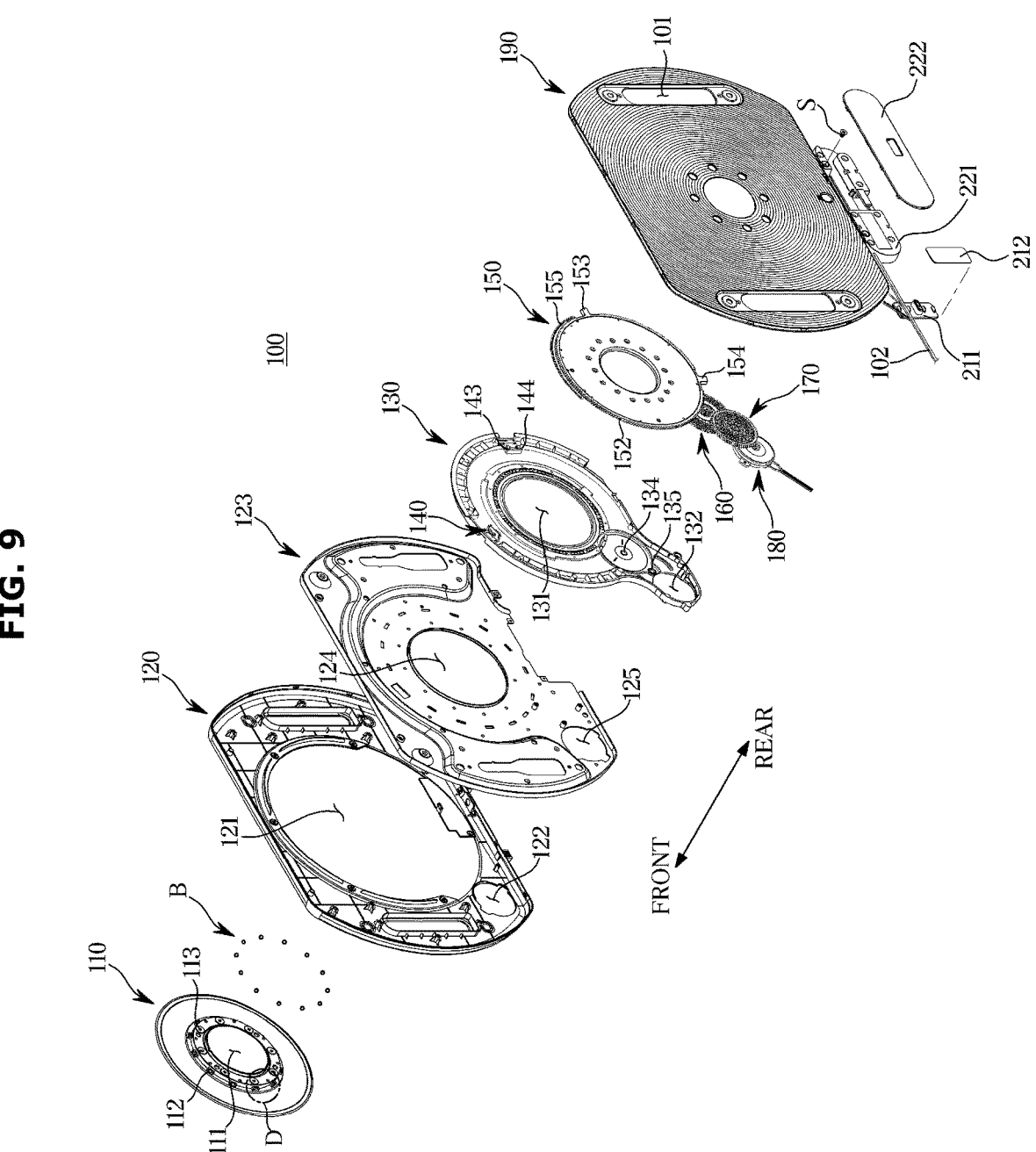
FIG. 9 is a view of the rotation device shown in FIG. 8 from a different angle according to one or more embodiments.

FIG. 8 is an exploded perspective view of the rotation device in the display apparatus according to one or more embodiments. FIG. 9 is a view of the rotation device shown in FIG. 8 from another angle one or more embodiments.

Hereinafter, a structure of the rotation device 100 according to one or more embodiments will be described in detail with reference to FIGS. 8 and 9.

Referring to FIGS. 8 and 9, the rotation device 100 according to one or more embodiments may include a rotating holder 110 coupled to the bracket 20 so as to rotate together with the bracket 20, a first case 120 in which the rotating holder 110 is rotatably coupled, a case reinforcing member 123 coupled to the first case 120 to reinforce the strength of the first case 120, a fixed holder 130 fixedly coupled to the first case 120, a first gear 150 coupled to the rotating holder 110 so as to rotate together with the rotating holder 110, a second gear 160 and a third gear 170 rotating which are both interlocked with the first gear 150, the drive motor 180 providing a driving force, and a second case 190 coupled to the first case 120 to form the exterior of the rotation device 100. According to one or more embodiments, the rotation device 100 may include the third gear 170 to increase the gear ratio. Alternatively, the rotation device 100 may include the first gear 150 and the second gear 160 and may not include the third gear 170. The first case 120 may be a first rotation device case 120, and the second case 190 may be a second rotation device case 190.

The rotating holder 110 may be coupled to the bracket 20. The rotating holder 110 may include first fastening holes 113. The fastener S may pass through the first fastening hole 113 and be coupled to the bracket bosses 22.

The rotating holder 110 may include a first hollow 111 at a center thereof. The first hollow 111 may be formed through the rotation center of the rotating holder 110 and a periphery thereof to prevent a flexible printed circuit board (FPCB) or the like from being twisted by the rotation of the display module 10. When connection via the FPCB is not required, when the rotation device 100 is arranged to enable wireless connection, the rotating holder 110 may eliminate the first hollow 111.

The rotating holder 110 may include one or more ball receiving grooves 112 to receive one or more balls B. The ball receiving grooves 112 may be provided in a plurality corresponding to the number of balls B. The balls B received in the ball receiving grooves 112 may be rotatable within the ball receiving grooves 112. The rotation of the balls B within the ball receiving grooves 112 may allow the rotating holder 110 to rotate smoothly with respect to the fixed holder 130. In addition, a distance between the rotating holder 110 and the fixed holder 130 in a front-to-back direction may be maintained. The front back direction may be the direction in which a user looks at the display panel 30.

The first case 120 may be coupled with the second case 190 to accommodate the fixed holder 130, the first to third gears 150, 160, and 170, and the drive motor 180 therein.

The first case 120 may include a second hollow 121 having a larger diameter than the first hollow 111. In addition, the first case 120 may include a first motor hole 122 into which the drive motor 180 is inserted.

The case reinforcing member 123 may be coupled to the first case 120 to increase the strength of the first case 120. The first case 120 and the second case 190 may be provided by injection molded product. Since the injection molded product may have weak strength and may be damaged, the case reinforcing member 123 made of a metallic material may be coupled to the first case 120 to reinforce the strength of the first case 120 and the second case 190.

The case reinforcing member 123 may include a third hollow 124 having a smaller diameter than the second hollow 121, but a larger diameter than the first hollow 111. Furthermore, the case reinforcing member 123 may include a second motor hole 125 arranged for insertion of the drive motor 180 and corresponding to the first motor hole 122.

The fixed holder 130 may be coupled to be fixedly secured within the first case 120 and the second case 190. Unlike the rotating holder 110, the fixed holder 130 may be arranged to maintain a fixed state regardless of the rotation of the display module 10.

The fixed holder 130 may include a fourth hollow 131 corresponding to the third hollow 124 and a third motor hole 132 corresponding to the second motor hole 125. The fixed holder 130 may include a ring-shaped ball guide portion 133 arranged to guide the balls B. The ball guide portion 133 may be provided in the form of a groove into which the balls B are inserted. The ball guide portion 133 may form a travel path for the balls B.

The fixed holder 130 may include a first gear coupling portion 134 to which the second gear 160 is coupled, and a second gear coupling portion 135 to which the third gear 170 is coupled. The fastener, such as a screw, may pass through the second gear 160 and be fastened to the first gear coupling portion 134, so that the second gear 160 may be rotatably coupled to the first gear coupling portion 134. Similarly, the third gear 170 may be rotatably coupled to the second gear coupling portion 135 by fastening the fastener, such as a screw, passing through the third gear 170 to the second gear coupling portion 135.

A detection sensor 140 for detecting a rotation amount of the first gear 150 may be coupled to the fixed holder 130. The fixed holder 130 may be provided with a first switch 143, which is arranged to push a first push protrusion 153 of the first gear 150 when the display module 10 is positioned in the landscape mode. In addition, the fixed holder 130 may be provided with a second switch 144, which is arranged to push a second push protrusion 154 of the first gear 150 when the display module 10 is positioned in the portrait mode.

The first gear 150 may be coupled to the rotating holder 110 so as to rotate together with the rotating holder 110. The first gear 150 may include a fifth hollow 158 corresponding to the fourth hollow 131. The first gear 150 may include a second fastening hole 157 corresponding to the first fastening hole 113 in order to be coupled to the rotating holder 110. The fastener S may pass through the second fastening hole 157 and the first fastening hole 113 and then be coupled to the bracket bosses 22.

The first gear 150 may include a disc-shaped first body portion 151 and a first gear portion 152 formed along a circumferential surface of the first body portion 152. According to one or more embodiments, the first gear portion 152 may be provided as a helical gear. Furthermore, the first gear 150 may include the first push protrusion 153 protruding radially from the circumferential surface of the first body 152, and a second push protrusions 154 spaced apart from the first push protrusion 153.

In addition, the first gear 150 may be coupled to a disc portion 155 including a plurality of slits 156. The disc portion 155 may be coupled to an edge of one region of the first gear 150, wherein the one region may be approximately one-fourth of the circumference of the disc portion 155. In other words, the disc portion 155 may be disposed over a range of approximately 90 degrees along a circumferential direction of the first gear 150.

The second gear 160 may be arranged to mesh with the first gear 150, and the third gear 170 may be arranged to mesh with the second gear 160 and a drive gear 181 of the drive motor 180.

The second case 190 may include a case hole 191. The case hole 191 may be arranged to correspond to the first fastening hole 113 and the second fastening hole 157, and may have a diameter larger than the outer diameter of the fastener S. Since the case hole 191 has a larger diameter than the fastener S, the fastener S may couple the first gear 150, the rotating holder 110, and the bracket 20 after passing through the case hole 191, so that the fastening member S may not interfere with the second case 190. In other words, although the fastener S is coupled to the bracket bosses 22 through the case hole 191, the second fastening hole 157, and the first fastening hole 113, the second case 190 and the bracket 20 may be relatively rotatable.

The second case 190 may include a motor home 192 into which the drive motor 180 is inserted.

By including the first case 120, the case reinforcing member 123, the fixed holder 130, and the second case 190, with the first to third motor hoes 122, 125, and 132 and the motor home 192, respectively, the drive motor 180 may be accommodated in the first case 120 and the second case 190, and a portion of the drive motor 180 may protrude to the outside of the first case 120. Accordingly, the drive motor 180 may be accommodated in the first case 120 and the second case 190 even if the thickness of the drive motor 180 is relatively somewhat thicker than the thickness of the rotation device 100. Furthermore, it is possible to prevent the overall thickness of the rotation device 100 from becoming thicker. Furthermore, when the drive motor 180 is accommodated therein, the thickness of the rotation device 100 may be prevented from becoming thicker due to the thickness of the case and a gap between the drive motor 180 and the case.

The second guide holder 220 may be coupled, mounted, and/or secured to the rotation device 100. The second guide holder 220 may be disposed on the lower side of the rotation device 100. The second guide holder 220 may be mounted to the second case 190 via the fastener S. The case of the second guide holder 220 may be mounted to the second case 190 from the lower side of the second case 190 via the fastener S.

Figure 10:
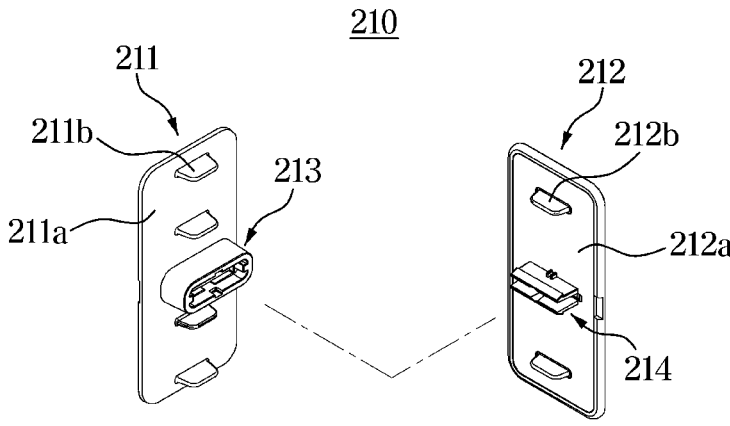
FIG. 10 is an exploded perspective view of a first guide holder in the display apparatus according to one or more embodiments.
Figure 11:
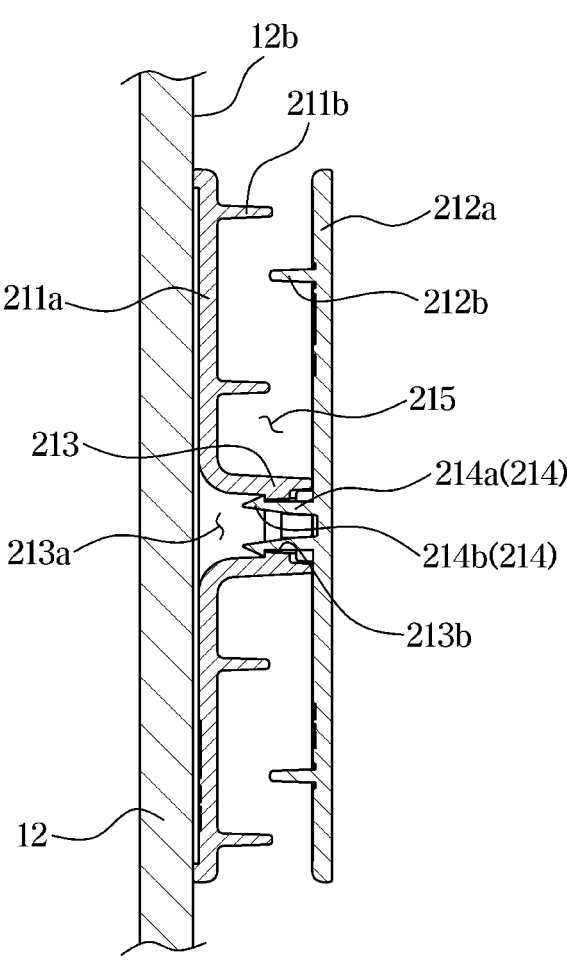
FIG. 11 is a cross-sectional view of the first guide holder shown in FIG. 10 according to one or more embodiments.

FIG. 10 is an exploded perspective view of the first guide holder in the display apparatus according to one or more embodiments. FIG. 11 is a cross-sectional view of the first guide holder shown in FIG. 10 according to one or more embodiments. FIG. 11 is a cross-sectional view showing a case where the first guide holder is attached (e.g., bonded) to the rear cover.

Referring to FIGS. 10 and 11, the display apparatus according to an embodiment may include the guide holder 200 for guiding and holding the cable 5. The guide holder 200 may include the first guide holder 210 and the second guide holder 220.

The first guide holder 210 may be attached to a rear surface 12b of the rear cover 12. The first guide holder 210 may include the adhesive member 211 and the mounting member 212. The adhesive member 211 may be attached to the rear surface 12b of the rear cover 12. A guide space 215 may be formed between the adhesive member 211 and the mounting member 212, in which the cable 5 is guided.

The adhesive member 211 may include a first base 211a, a first guide protrusion 211b, and an extension 213. The first base 211a may be attached to the rear surface 12b of the rear cover 12. The first guide protrusion 211b may guide the cable 5 wound on the first guide holder 210. The first guide protrusion 211b may protrude backwardly from the first base 211a. The first guide protrusion 211b may protrude toward the mounting member 212 when the mounting member 212 is mounted on the adhesive member 211. The first guide protrusions 211b may be provided in a plurality.

The extension 213 may protrude backwardly from the first base 211a. The extension 213 may allow the adhesive member 211 and the mounting member 212 to be coupled. The extension 213 may be mounted on a mounting protrusion 214 of the mounting member 212. The extension 213 may include a hollow. The extension 213 may receive the mounting protrusion 214. The extension 213 may be referred to as a receiving protrusion. A mounting space 213a to which the mounting protrusion 214 is mounted may be formed on the interior of the extension 213. The extension 213 may be formed in the middle of the first base 211a. However, a location of the extension 213 is not limited thereto.

The extension 213 may include a first hook portion 213b. The first hook portion 213b may protrude inwardly of the extension 213 such that a second hook portion 214b is caught.

The mounting member 212 may include a second base 212a, a second guide protrusion 212b, and the mounting protrusion 214. The second guide protrusion 212b may guide the cable 5 wound on the first guide holder 210. The second guide protrusion 212b may protrude forwardly from the second base 212a. The second guide protrusion 212b may protrude toward the mounting member 212 when the mounting member 212 is mounted on the adhesive member 211. The second guide protrusions 212b may be provided in a plurality.

The mounting protrusion 214 may protrude forward from the second base 212a. The mounting protrusion 214 may be mounted on the extension 213 to allow the adhesive member 211 and the mounting member 212 to be coupled. The mounting protrusion 214 may include a protrusion 214a and the second hook portion 214b. The protrusion 214a may protrude from the second base 212a toward the adhesive member 211. The second hook portion 214b may extend upward and/or downward from a front end of the protrusion 214a. The second hook portion 214b may allow the mounting protrusion 214 to be mounted on the extension 213. The second hook portion 214b may be caught on the first hook portion 213b.

The shape of the first guide holder 210 is not limited thereto and may include various shapes as long as it may guide and/or hold the cable 5.

Figure 12:
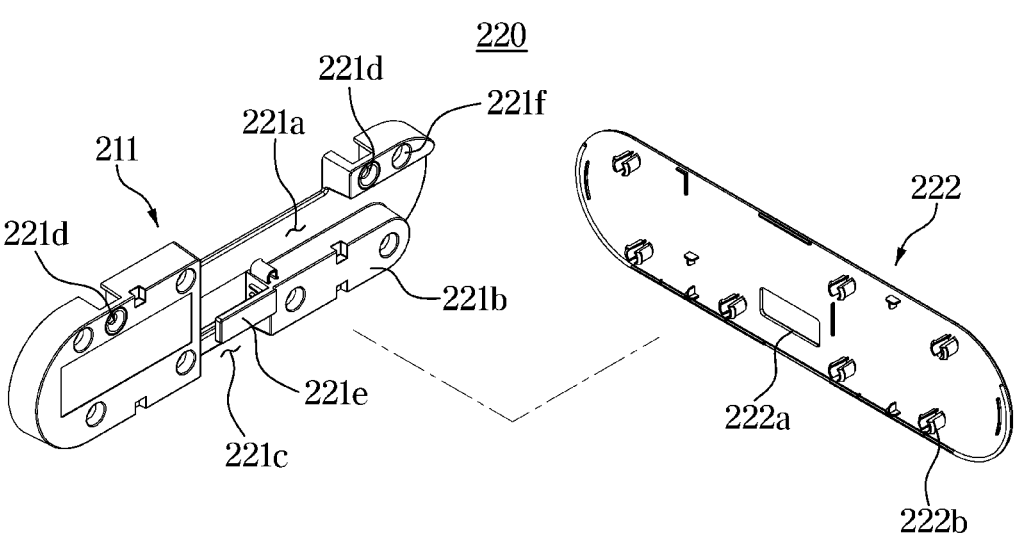
FIG. 12 is an exploded perspective view of a second guide holder in the display apparatus according to one or more embodiments.

FIG. 12 is an exploded perspective view of the second guide holder in the display apparatus according to one or more embodiments.

Referring to FIGS. 9 and 12, the second guide holder 220 may be mounted on the rotation device 100 (see FIG. 9). The case 221 of the second guide holder 220 may be secured to the rotation device 100 by the fastener S.

The second guide holder 220 may include the case 221 and the cover 222. The cover 222 may be coupled to the case 221. A portion of the cable 5 may be accommodated between the case 221 and the cover 222.

The case 221 may include a receiving portion 221a, a winding portion 221b, a lower hole 221c, a mounting hole 221d, a separation guide 221e, and a coupling hole 221f.

The receiving portion 221a may be formed in the case 221 to receive the cable. The winding portion 221b may protrude from the receiving portion 221a. When the cover 222 is coupled to the case 221, the winding portion 221b may protrude toward the cover 222. The cable may be wound on the winding portion 221b. The winding portion 221b may guide the cable. The lower hole 221c may be formed at a lower portion of the case 221. The cable may be connected to an external power source of the display apparatus through the lower hole 221c. The lower hole 221c may be referred to as an opening 221c.

The mounting hole 221d may allow the second guide holder 220 to be mounted on the rotation device 100. The mounting hole 221d may be mounted on the second rotation device case 190 by means of the fastener S. The mounting holes 221d may be provided in a plurality.

The separation guide 221e may extend from the winding portion 221b. The separation guide 221e may extend to the left or right of the winding portion 221b to prevent the cable 5 directing to the lower hole 221c from being separated from the case 221. In other words, the separation guide 221e may guide the cable 5. In addition, when the case 221 and the cover 222 are coupled, a user may separate the cover 222 from the case 221 by pressing the separation guide 221e. A position of the separation guide 221e is not limited to that shown.

The coupling hole 221f may allow the case 221 and cover 222 to be coupled. The coupling hole 221f may be coupled to the coupling protrusion 222b formed on the cover 222. The coupling holes 221f may be provided in a plurality.

The cover 222 may cover the case 221 so that the cable may be guided without being separated. The cover 222 may be coupled to the case 221 at the rear side of the case 221. The cover 222 may include a separation hole 222a and a coupling protrusion 222b.

After the cover 222 is coupled to the case 221, the separation guide 221e may be disposed within the separation hole 222a. The user may separate the separation guide 221e from the separation hole 222a by pressing the separation guide 221e, so that the case 221 and the cover 222 may be separated.

The coupling protrusion 222b may protrude toward the case 221 so that the cover 222 may be coupled to the case

221. The coupling protrusion 222b may be inserted into the coupling hole 221f provided in the case 221. The coupling protrusions 222b may be provided in a plurality. The plurality of coupling protrusions 222b may be formed along an edge of the case 221. However, the position and shape of the coupling protrusions 222b are not limited thereto.

The shape of the second guide holder 220 is not limited thereto and may include various shapes as long as it may guide and/or hold the cable 5.

Figure 13:
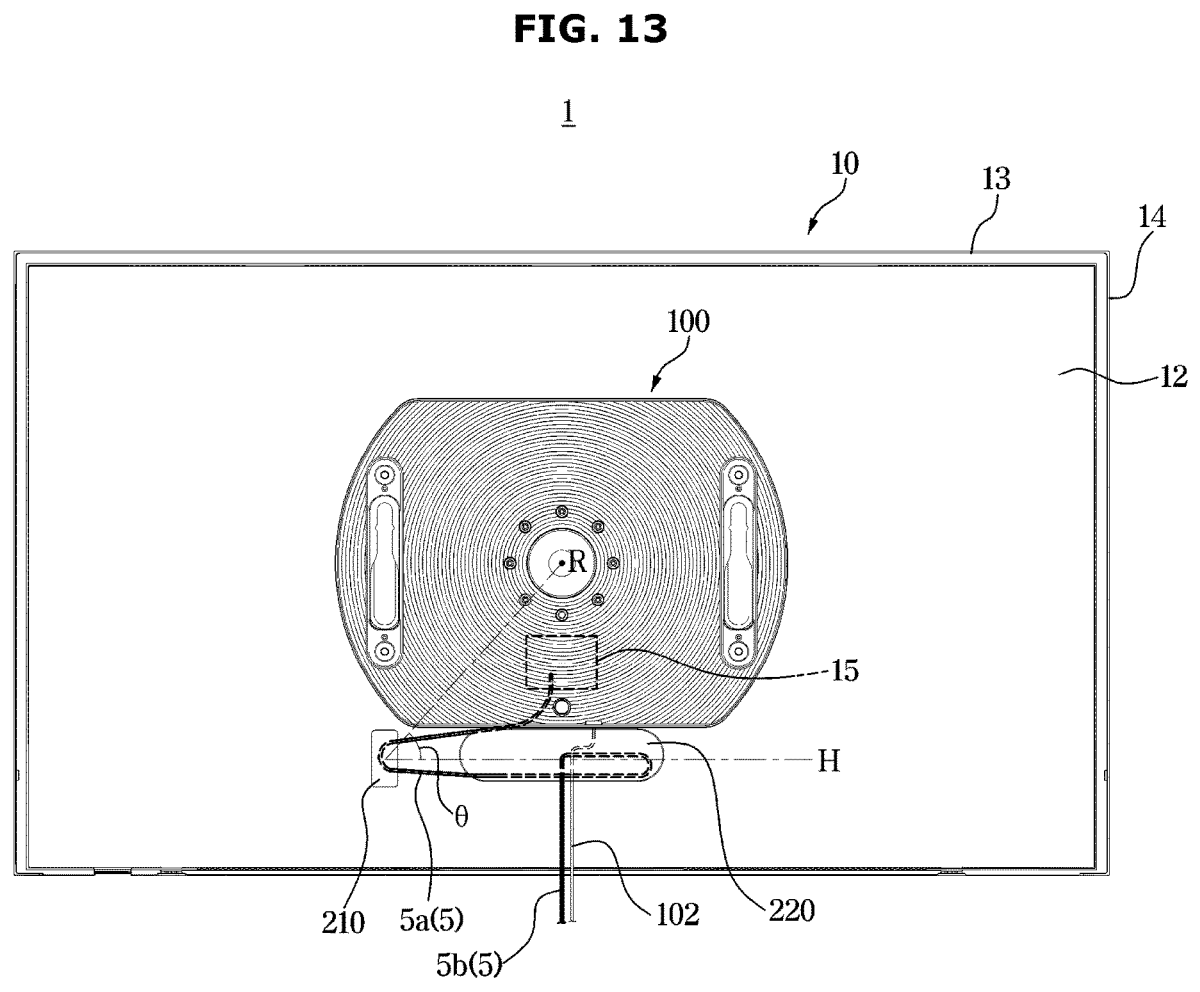
Figure 14:
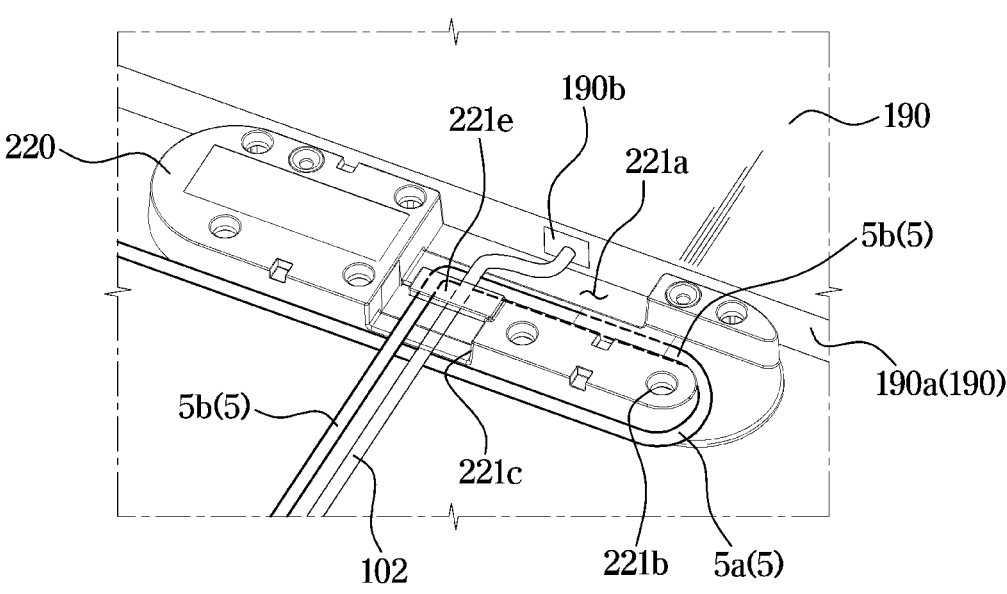
FIG. 14 is a perspective view of the second guide holder and a cable in the display apparatus shown in FIG. 13 according to one or more embodiments.
Figure 15:
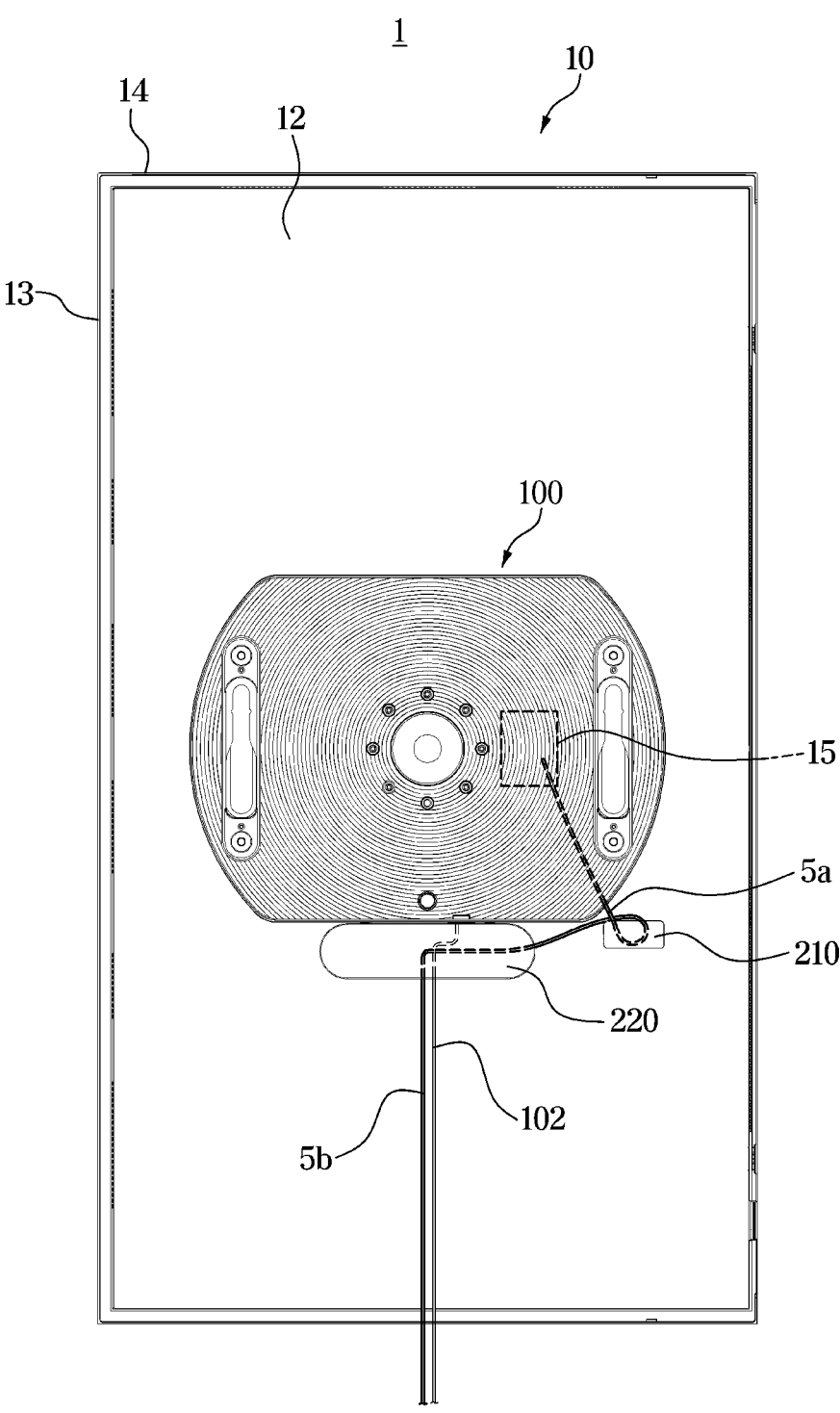
FIG. 15 is a top view from the rear showing the display apparatus shown in FIG. 13 rotated according to one or more embodiments.

FIG. 13 is a plan view from the rear of the display apparatus according to one or more embodiments. FIG. 14 is a view of the second guide holder and the cable in the display apparatus shown in FIG. 13 according to one or more embodiments. FIG. 15 is a plan view from the rear showing the display apparatus rotated according to one or more embodiments. FIG. 13 may show the display module in the second mode. FIG. 15 may show the display module in the first mode.

Referring to FIG. 13, the display apparatus according to one or more embodiments may include the cable 5. The cable 5 may be connected to the display module 10. The cable 5 may be electrically and/or physically connected to electrical components accommodated in the housing 11 to drive and control the display module 10.

The cable 5 may be connected to the connector portion 15 formed on the rear cover 12. In addition, the cable 5 connected to the connector portion 15 may be guided by the first guide holder 210 and the second guide holder 220 to be connected to an external power source. The connector portion 15 may be concealed or hidden by the rear cover 12 when the rotation device 100 is coupled to the rear cover 12.

The first guide holder 210 may be attached to the rear cover 12. In addition, the first guide holder 210 may be disposed below the rotation device 100 in the vertical direction of the rear cover. The first guide holder 210 may form an angle θ with the rotation axis N of the display module based on a horizontal axis H. The first guide holder 210 may form an angle of 45 degrees with the rotation axis N or the rotation center R of the display module based on the horizontal axis H.

The second guide holder 220 may be secured to the rotation device 100 below the rotation device 100. The second guide holder 220 may be disposed below the rotation center R of the display module 10 (see FIGS. 1 and 2).

The cable connected to the connector portion 15 may be passed through the first guide holder 210 and then through the second guide holder 220. The cable 5 may be guided through the first guide holder 210 and the second guide holder 220 in that order. The cable 5 may pass between the rotation device 100 in the vertical direction, be wound around the first guide holder 210, pass through the second guide holder 220 after passing through a lower side of the second guide holder 220 passing, and then exit through the lower hole 221c. The cable 5 exiting the lower hole 221c may be connected to the outside.

However, the order or manner in which the cable 5 is guided and/or held by the guide holders 200 is not limited thereto and may be modified in various ways.

With such a plurality of guide holders 200 as described above, the cable 5 may not interfere with other components of the display apparatus 1. Furthermore, twisting and disconnection of the cable 5 may be prevented.

The cable 5 may include a first portion 5a and a second portion 5b. The first portion 5a and the second portion 5b may vary depending on the guiding and holding position. The first portion 5a may be a part of the cable 5 from the first guide holder 210 until the cable 5 is inserted into the second guide holder 220. The second portion 5*b* may be a part of the cable 5 connected to the outside from the receiving portion 221*a* of the second guide holder 220.

Referring to FIG. 14, a portion of the cable 5 may be accommodated in the case 221 of the second guide holder 220. The cable 5 may be wound around the winding portion 221*b*, and a portion of the cable 5*b* may be accommodated in the receiving portion 221*a*. The cable 5*b* may be disposed between a step formed by the receiving portion 221*a* and the winding portion 221*b*. The cable 5 wound on the winding portion 221*b* may be connected to the outside via the separation guide 221*e* and the lower hole 221*c* in such order.

The rotation drive cable 102 may be connected to internal electrical components of the rotation device 100 via a connector hole 190*b* formed on a lower surface 190*a* of the second rotation device case 190. The rotation drive cable 102 may be connected to the outside via the receiving portion 221*a*, the separation guide 221*e*, and the lower hole 221*c* in such order.

Referring to FIG. 15, in the display apparatus according to one or more embodiments, when the display module 10 rotates, the first portion 5*a* of the cable 5 may be moved. However, although the display module 10 is rotated, the second portion 5*b* of the cable 5 may not be moved. Although the display module 10 is rotated, the arrangement of the first portion 5*a* may change, but the second portion 5*b* may be fixed by the second guide holder 220.

The length of the first portion 5*a* at which a tensile force is generated when the display module 10 is in the second mode may be longer than the length of the first portion 5*a* at which a tensile force is generated when the display module 10 is in the first mode. Although a tensile force is generated at the first portion 5*a* in the second mode of the display module 10, a tensile force may not be generated at the first portion 5*a* in the first mode. Accordingly, although the display module 10 is rotated from the second mode to the first mode, the length of the first portion 5*a* of the cable required in the second mode may only be sufficient to prevent the cable 5 from disconnecting under tension.

Figure 16:
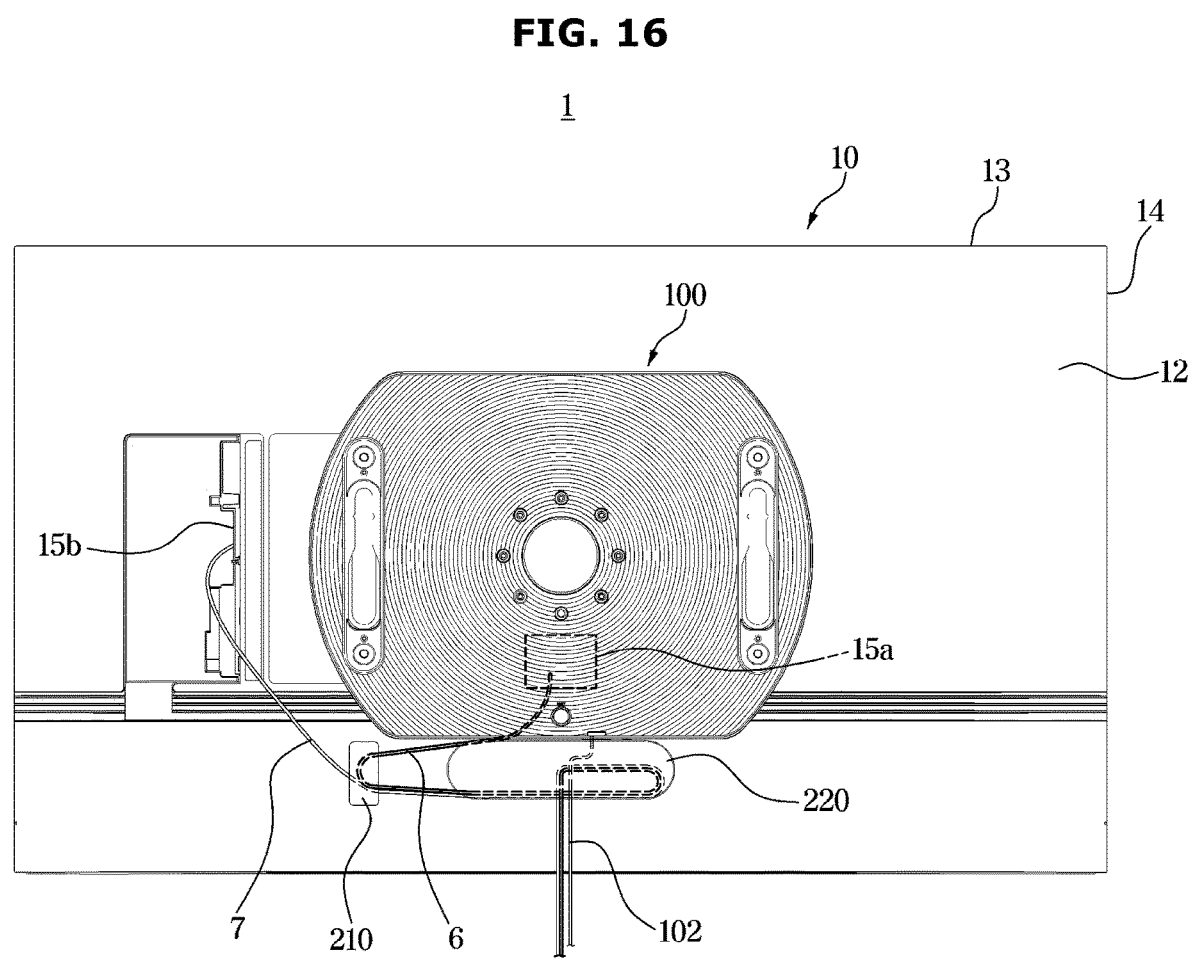
Figure 17:
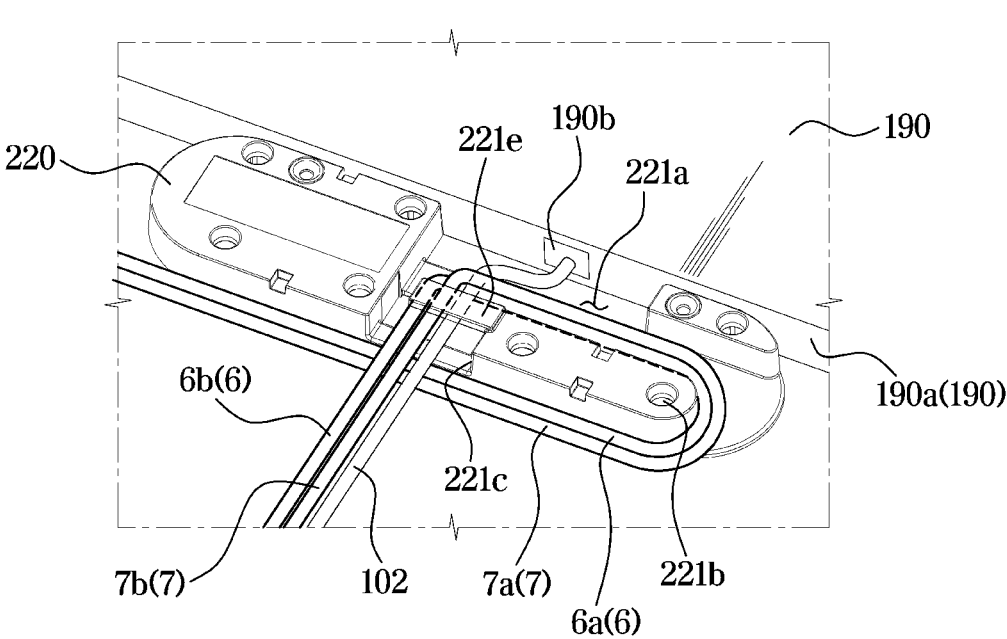
FIG. 17 is a perspective view of the second guide holder and the cable in the display apparatus shown in FIG. 16 according to one or more embodiments.
Figure 18:
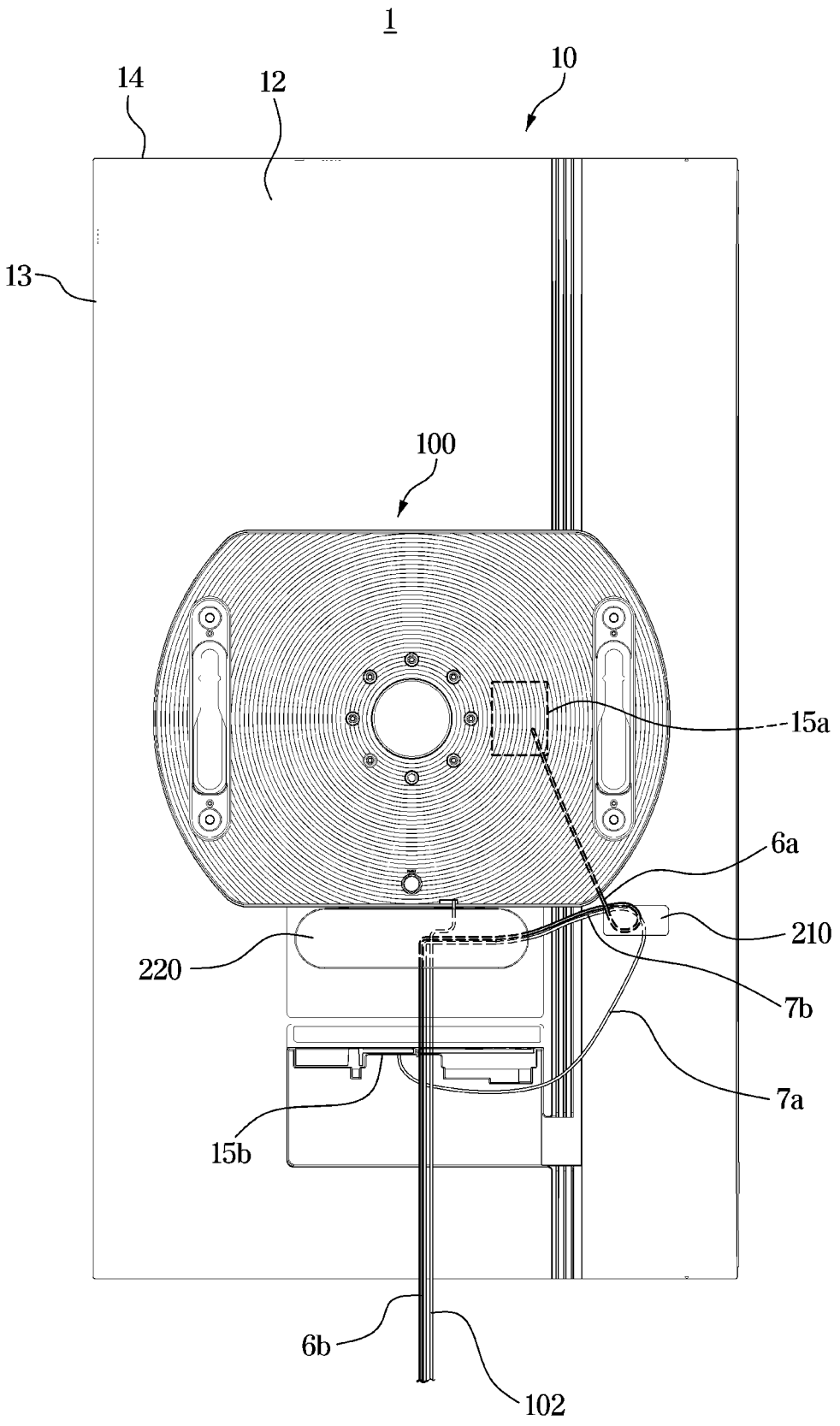
FIG. 18 is a top view from the rear showing the display apparatus shown in FIG. 16 rotated according to one or more embodiments.

FIG. 16 is a plan view from the rear of the display apparatus according to one or more embodiments. FIG. 17 is a view showing the second guide holder and the cable in the display apparatus shown in FIG. 16 according to one or more embodiments. FIG. 18 is a plan view from the rear showing the display apparatus shown in FIG. 16 rotated according to one or more embodiments.

Referring to FIG. 16, the display apparatus according to an embodiment may include the cables 6 and 7. The cables 6 and 7 may be provided in a plurality. The plurality of cables 6 and 7 may be electrically and/or physically connected to electrical components accommodated in the housing 11 to drive and control the display module 10.

In addition, a plurality of connector portions 15 may be formed on the rear cover 12. The plurality of connector portions 15 may include a first connector portion 15*a* and a second connector portion 15*b*.

The first connector portion 15*a* may be formed on a central portion of the rear cover 12. When the rotation device 100 is coupled to the rear cover 12, the first connector portion 15*a* may be concealed or hidden by the rear cover 12. The second connector portion 15*b* may be formed on a lateral side of the rotation device 100. The second connector portion 15*b* may be formed on the left side of the first connector portion 15*a* or the rotation device 100.

The plurality of cables 6 and 7 may include the first cable 6 and the second cable 7. The first cable 6 may be connected to the first connector portion 15*a*, and the second cable 7 may be connected to the second connector portion 15*b*. In addition, the first cable 6 and the second cable 7 may be guided by the first guide holder 210 and the second guide holder 220 to be connected to an external power source, or the like.

The plurality of cables 6 and 7 may be passed through the first guide holder 210 and then through the second guide holder 220. The cables 6 and 7 may be guided through the first guide holder 210 and the second guide holder 220 in that order. However, the order or manner in which the cables 6 and 7 are guided and/or held by the guide holders 200 is not limited thereto and may be modified in various ways.

The plurality of cables 6 and 7 may each include first portions 6*a* and 7*a* and second portions 6*b* and 7*b*. The first portions 6*a* and 7*a* and the second portions 6*b* and 7*b* may vary depending on the guiding and holding positions. The first portions 6*a* and 7*a* may be the cables 6*a* and 7*a* from the first guide holder 210 until they are inserted into the second guide holder 220. The second portions 6*b* and 7*b* may be the cables 6*b* and 7*b* connected to the outside from the receiving portion 221*a* of the second guide holder 220.

Referring to FIG. 17, a portion of the cables 6*b* and 7*b* may be accommodated in the case 221 of the second guide holder 220. The cables 6 and 7 may be wound around the winding portion 221*b*, the portions of the cables 6*b* and 7*b* may be accommodated in the receiving portion 221*a*. The cables 6*b* and 7*b* may be disposed between the step formed by the receiving portion 221*a* and the winding portion 221*b*. The cables 6*b* and 7*b* wound on the winding portion 221*b* may be connected to the outside through the separation guide 221*e* and the lower hole 221*c* in such order.

Referring to FIG. 18, in the display apparatus according to one or more embodiments, when the display module 10 is rotated, the first portions 6*a* and 7*a* of the cables 6 and 7 may be moved. However, although the display module 10 is rotated, the second portions 6*b* and 7*b* of the cables 6 and 7 may not be moved. Although the display module 10 is rotated, the arrangement of the first portions 6*a* and 7*a* may change, but the second portions 6*b* and 7*b* may be fixed by the second guide holder 220.

The length of the first portions 6*a* and 7*a* at which a tensile force is generated when the display module 10 is in the second mode may be longer than the length of the first portions 6*a* and 7*a* at which a tensile force is generated when the display module 10 is in the first mode. Although a tensile force is generated at the first portions 6*a* and 7*a* in the second mode of the display module 10, a tensile force may not be generated at the first portions 6*a* and 7*a* in the first mode. Accordingly, although the display module 10 is rotated from the second mode to the first mode, disconnection due to tension of the cables 6 and 7 may be prevented by only the length of the first portions 6*a* and 7*a* of the cable required in the second mode.

Figure 19:
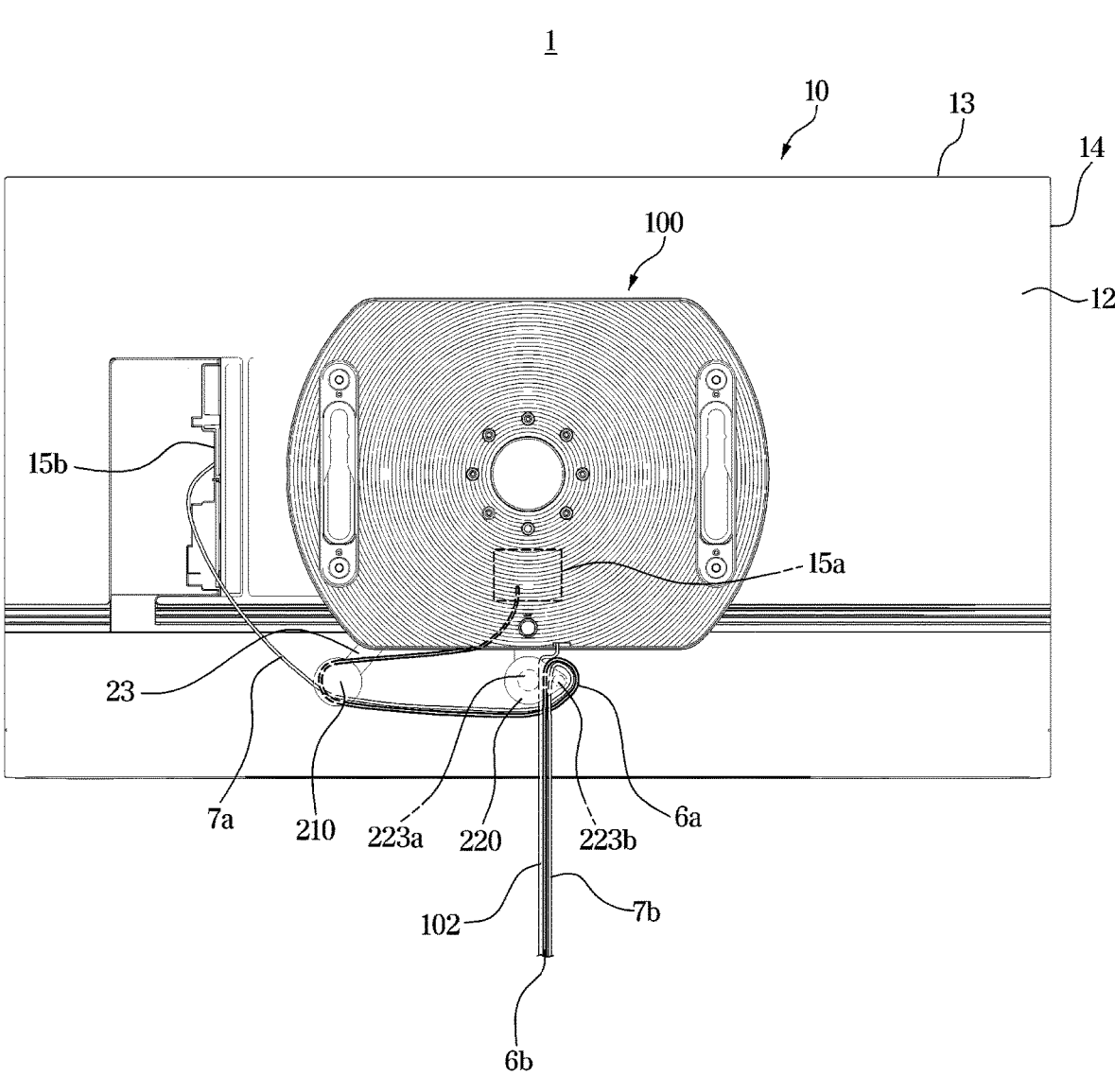
FIG. 19 is a top view from the rear of the display apparatus according to one or more embodiments.
Figure 20:
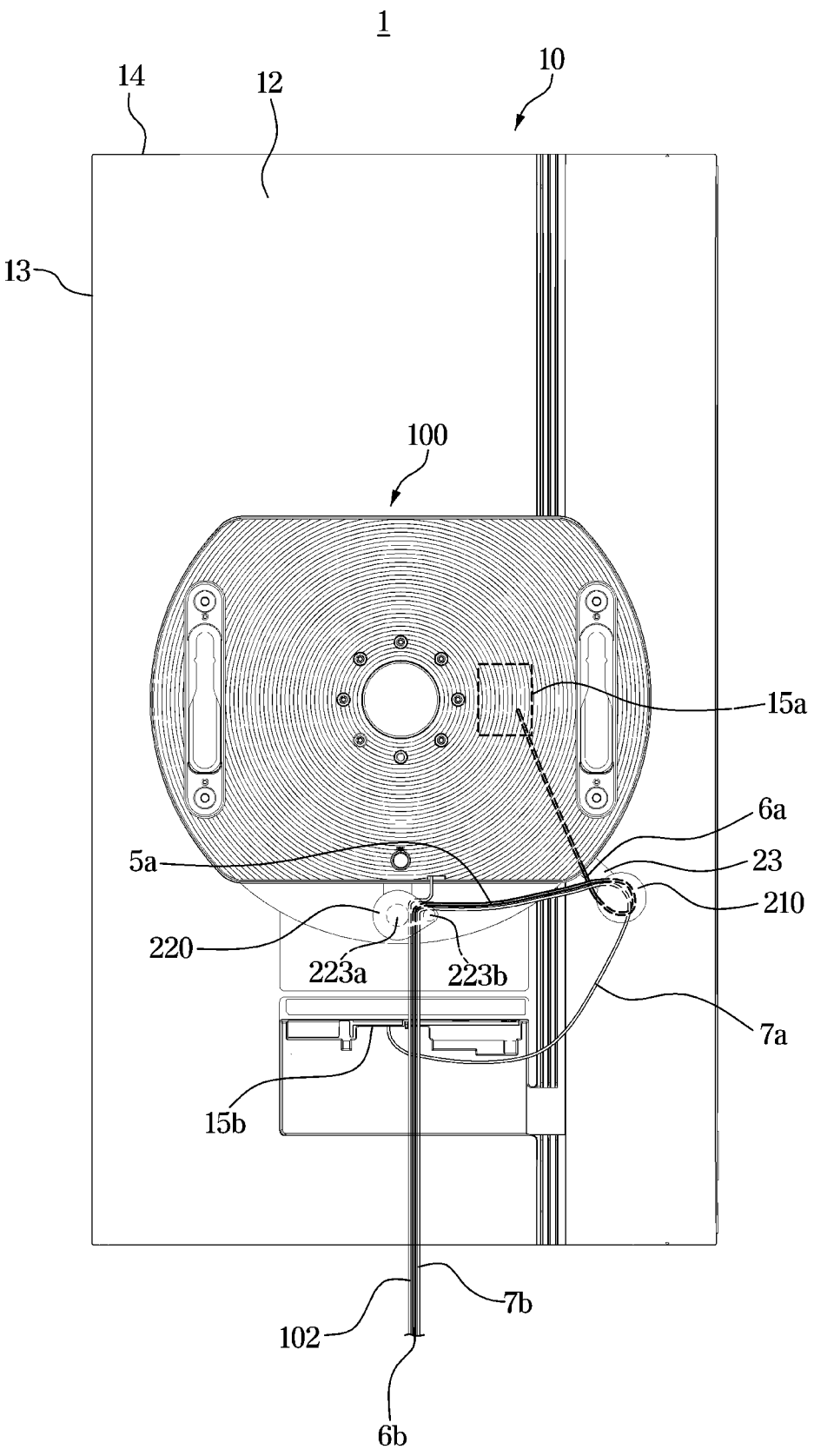
FIG. 20 is a top view from the rear showing the display apparatus shown in FIG. 19 rotated according to one or more embodiments.

FIG. 19 is a plan view from the rear of the display apparatus according to one or more embodiments. FIG. 20 is a plan view from the rear showing the display apparatus shown in FIG. 19 rotated according to one or more embodiments.

Referring to FIGS. 19 and 20, the display apparatus according to one or more embodiments may include the plurality of guide holders 200. The plurality of guide holders 200 may include the first guide holder 210 and the second guide holder 220. The first guide holder 210 may extend from the coupling bracket 20. The coupling bracket 20 may include an extension arm 23 and the first guide holder 210. The extension arm 23 may extend from the central portion of the coupling bracket 20 in a direction of 45 degrees relative to the horizontal axis H. The first guide holder 210 may be formed at one end of the extension arm 23.

The second guide holder 220 may be coupled, mounted, and/or secured to the rotation device 100. The second guide holder 220 may include a plurality of guide portions 223*a* and 223*b*. The plurality of guide portions 223*a* and 223*b* may form a guide space for guiding the cables 6 and 7 there between. The cables 6, 7, and 102 may pass through the guide space and be connected to an external power source of the display apparatus 1.

While the disclosure has been illustrated and described with reference to one or more embodiments, it will be understood that the one or more embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiments described herein may be used in conjunction with any other embodiments described herein.

What is claimed is:

1. A display apparatus comprising:
   a display panel;
   a housing comprising a rear cover and configured to receive the display panel;
   a rotation device coupled to a rear side of the rear cover and configured to rotate the housing;
   a cable provided on the rear side of the rear cover and configured to be connected to a first electrical component in the housing;
   a first guide holder attached to the rear side of the rear cover and configured to movably guide the cable and hold the cable; and
   a second guide holder fixed to the rotation device and configured to guide and hold the cable.

2. The display apparatus of claim 1, wherein the rear cover comprises a connector portion configured to allow the cable to be connected to the first electrical component in the housing, and
   wherein the cable is sequentially connected the connector portion, the first guide holder, and the second guide holder to an outside of the display apparatus.

3. The display apparatus of claim 2, wherein the first guide holder is attached to the rear cover, and the second guide holder is below the rotation device in a vertical direction of the rear cover.

4. The display apparatus of claim 3, wherein the rotation device is coupled to a central portion of the rear cover, and
   wherein a rotation axis of the rotation device is located at an angle of 45 degrees from the first guide holder based on a horizontal axis.

5. The display apparatus of claim 4, wherein the housing is configured to be arranged in a first mode in a state in which a long side of the housing extends in a first direction and a short side of the housing extends in a second direction,
   wherein the housing is further configured to be arranged in a second mode in a state in which the long side of the housing extends in the second direction and the short side of the housing extends in the first direction, and
   wherein the housing is configured to rotate from the first mode to the second mode and from the second mode to the first mode.

6. The display apparatus of claim 5, wherein the connector portion is formed in the central portion of the rear cover and configured to be covered by the rotation device.

7. The display apparatus of claim 6, wherein the connector portion is a first connector portion, and

wherein the rear cover further comprises a second connector portion formed on a lateral side of the first connector portion.

8. The display apparatus of claim 7, wherein the cable is a first cable, and
   wherein the display apparatus further comprises a second cable connected to a second electrical component in the housing and sequentially connected to the second connector portion, the first guide holder, and the second guide holder to the outside of the display apparatus.

9. The display apparatus of claim 1, further comprising:
   a coupling bracket coupled to the rotation device and the rear cover and configured to couple the rotation device to the rear cover.

10. The display apparatus of claim 9, wherein the coupling bracket comprises the first guide holder, and
    wherein the first guide holder has an angle of 45 degrees relative to a central portion of the rear cover and a horizontal axis.

11. The display apparatus of claim 1, wherein the first guide holder comprises:
    an adhesive member attached to a rear wall of the rear cover; and
    a mounting member mounted on the adhesive member, and
    wherein the adhesive member comprises an extension extending toward the mounting member and configured to enable the cable to be wound between the adhesive member and the mounting member.

12. The display apparatus of claim 1, wherein the second guide holder comprises:
    a case coupled to the rotation device and configured to accommodate the cable, and
    a cover coupled to the case and configured to cover the cable accommodated in the case.

13. The display apparatus of claim 12, wherein the case comprises:
    a receiving portion configured to receive the cable passing through the first guide holder,
    a winding portion protruding from the receiving portion toward the cover and configured to enable the cable to be wound, and
    a lower hole opened in a lower portion of the case and configured to enable the cable wound on the winding portion to be connected to the outside of the display apparatus.

14. The display apparatus of claim 1, further comprising a coupling bracket coupled to the rotation device and the rear cover and configured to couple the rotation device to the rear cover,
    wherein the rotation device comprises:
    a drive motor,
    a plurality of gears interlocked with the drive motor, and
    a rotating holder configured to rotate together with the coupling bracket.

15. The display apparatus of claim 14, wherein the rotation device comprises:
    a first case coupled to the rotating holder and configured to receive the drive motor, the plurality of gears, and the rotating holder; and
    a second case coupled to a rear side of the first case.

16. The display apparatus of claim 1, wherein the first guide holder is configured to be detachable from the rear side of the rear cover.

17. The display apparatus of claim 1, wherein the first guide holder is configured to guide the cable such that the cable is wound at least once such that portions of the cable overlap.

18. The display apparatus of claim 1, wherein the second guide holder is configured to guide the cable such that the cable is wound at least once such that portions of the cable overlap.

\* \* \* \* \*